(12) United States Patent
Shany et al.

(10) Patent No.: US 10,404,407 B2
(45) Date of Patent: Sep. 3, 2019

(54) GROEBNER-BASES APPROACH TO FAST CHASE DECODING OF GENERALIZED REED-SOLOMON CODES

(71) Applicant: SAMSUNG ELECTRONICS CO., LTD., Suwon-si, Gyeonggi-Do (KR)

(72) Inventors: Yaron Shany, Kfar Saba (IL); Jun-Jin Kong, Yongin-si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 28 days.

(21) Appl. No.: 15/683,456

(22) Filed: Aug. 22, 2017

(65) Prior Publication Data

US 2019/0068319 A1 Feb. 28, 2019

(51) Int. Cl.
| | |
|---|---|
| *H03M 13/03* | (2006.01) |
| *H04L 1/00* | (2006.01) |
| *H03M 13/15* | (2006.01) |
| *H03M 13/45* | (2006.01) |
| *H03M 13/00* | (2006.01) |

(52) U.S. Cl.
CPC ........ *H04L 1/0043* (2013.01); *H03M 13/153* (2013.01); *H03M 13/1515* (2013.01); *H03M 13/453* (2013.01); *H03M 13/6502* (2013.01)

(58) Field of Classification Search
CPC ............ H04L 1/0043; H03M 13/1515; H03M 13/153
See application file for complete search history.

(56) References Cited

U.S. PATENT DOCUMENTS

| | | | |
|---|---|---|---|
| 7,254,165 B2 | 8/2007 | Xie et al. | |
| 7,900,122 B2 | 3/2011 | Shen et al. | |
| 8,149,925 B2 | 4/2012 | Goldman et al. | |
| 8,209,590 B2 | 6/2012 | Shen et al. | |
| 8,245,117 B1 | 8/2012 | Wu | |
| 8,327,241 B2 | 12/2012 | Wu et al. | |
| 8,495,448 B2 | 7/2013 | Shen et al. | |
| 8,650,466 B2 | 2/2014 | Wu | |

(Continued)

OTHER PUBLICATIONS

Maria Bras-Amoros, et al., "From the Euclidean Algorithm for Solving a Key Equation for Dual Reed-Solomon Codes to the Berlekamp-Massey Algorithm," AAECC 2009, LNCS 5527, pp. 32-42, 2009.

(Continued)

*Primary Examiner* — Samir E Rizk (74) *Attorney, Agent, or Firm* — F. Chau & Associates, LLC (57) ABSTRACT

An application specific integrated circuit (ASIC) tangibly encodes a program of instructions executable by the integrated circuit to perform a method for fast Chase decoding of generalized Reed-Solomon (GRS) codes. The method includes using outputs of a syndrome-based hard-decision (HD) algorithm to find an initial Groebner basis G for a solution module of a key equation, upon failure of HD decoding of a GRS codeword received by the ASIC from a communication channel; traversing a tree of error patterns on a plurality of unreliable coordinates to adjoin a next weak coordinate, where vertices of the tree of error patterns correspond to error patterns, and edges connect a parent error pattern to a child error pattern having exactly one additional non-zero value, to find a Groebner basis for each adjoining error location; and outputting an estimated transmitted codeword when a correct error vector has been found.

20 Claims, 4 Drawing Sheets

(56) References Cited

U.S. PATENT DOCUMENTS

| | | |
|---|---|---|
| 8,674,860 B2 | 3/2014 | Wu |
| 8,850,298 B2 | 9/2014 | Wu |
| 8,908,810 B2 | 12/2014 | Arambepola et al. |
| 2007/0153724 A1 | 7/2007 | Cheon et al. |
| 2016/0301429 A1 | 10/2016 | Shany et al. |

OTHER PUBLICATIONS

Yingquan Wu, "Fast Chase Decoding Algorithms and Architecture for Reed-Solomon Codes," IEEE Transaction on Information Theory, vol. 56, No. 1, Jan. 2012.
Xinmiao Zhang, "Interpolation-Based Chase BCH Decoder," Information Theory and Applications Workshop (ITA), 2014, pp. 1-5.
Mostafa El-Khamy, et al., "Iterative Algebraic Soft-Decision List Decoding of Reed-Solomon Codes,"IEEE Journal on Selected Areas in Communications, vol. 24, No. 3, Mar. 2006.
James L. Massey, "Shift-Register Synthesis and BCH Decoding," IEEE Transactions on Information Theory, vol. IT-15, No. 1, Jan. 1969, pp. 122-127.
Peter Beelen, et al., "On Rational-Interpolation Based List-Decoding and List-Decoding Binary Goppa Codes," IEEE Transactions on Information Theory ( vol. 59, Issue: 6, Jun. 2013); pp. 1-16.
David Chase, "A Class of Algorithms for Decoding Block Codes With Channel Measurement Information," IEEE Transaction on Information Theory, vol. IT-18, No. 1, Jan. 1972, pp. 170-182.
Patrick Fitzpatrick, "On the Key Equation." IEEE Transaction on Information Theory, vol. 41, No. 5 Sep. 1995, pp. 1290-1302.
Rachit Agarwal, "On Computation of Error Locations and Values in Hermitian Codes,", Proc., IEEE Intl. Symp. Info. Theory, pp. 1-10, Dec. 11, 2007.
Section 5.1 of R. M. Roth, Introduction to Coding Theory, Cambridge University Press, 2006.
R. J. McEliece, "The Guruswami-Sudan decoding algorithm for Reed-Solomon codes," IPN Progress Report, vol. 42-153, May 2003.

GROEBNER-BASES APPROACH TO FAST CHASE DECODING OF GENERALIZED REED-SOLOMON CODES

BACKGROUND

Technical Field

Embodiments of the present disclosure are directed to methods of forming error correcting codes.

Discussion of the Related Art

In coding theory, generalized Reed-Solomon (GRS) codes form a class of error-correcting codes (ECCs) that are constructed using finite fields. GRS codes can be defined as follows. Let q be a prime power, and let $\mathbb{F}_q$ be the finite field of q elements. We will consider a primitive GRS code, C, of length n:=q−1 and designed distance $d \in \mathbb{N}^*$, d≥2. Note that since the most general GRS code, as defined, e.g., in Section 5.1 of R, M. Roth, *Introduction to Coding Theory*, Cambridge University Press, 2006, the contents of which are herein incorporated by reference in their entirety, may be obtained by shortening a primitive GRS code, there is no loss of generality in considering only primitive GRS codes. Let $\tilde{a}=(\tilde{a}_0, \ldots, \tilde{a}_{n-1}) \in (\mathbb{F}^*_q)^n$ be a vector of non-zero elements. For a vector $f=(f_0, f_1, \ldots, f_{n-1}) \in \mathbb{F}_q^n$, let $f(X):=f_0+f_1 X+ \ldots +f_{n-1}X^{n-1} \in \mathbb{F}_q[X]$. Now $C \subseteq \mathbb{F}_q^n$ is defined as the set of all vectors $f \in \mathbb{F}_q^n$ for which $\tilde{a}(X) \odot f(X)$ has roots $1, \alpha, \ldots, \alpha^{d-2}$ for some fixed primitive $\alpha \in \mathbb{F}_q$, where (-⊙-) stands for coefficient-wise multiplication of polynomials: for $f(X)=\Sigma_{i=0}^r f_i X^i$ and $g(X)=\Sigma_{i=0}^s g_i X^i$, let m:=min{r, s}, and define $f(X) \odot g(X) := \Sigma_{i=0}^m f_i g_i X^i$. GRS codes allow a precise control over the number of symbol errors and erasures correctable by the code during code design, in particular, it is possible to design GRS codes that can correct multiple symbol errors and erasures. GRS codes can also be easily decoded using an algebraic method known as syndrome decoding. This can simplify the design of the decoder for these codes by using small, low-power electronic hardware.

The syndrome of a received codeword y=x+e, where x is the transmitted codeword and e is an error pattern, is defined in terms of a parity matrix H. A parity check matrix of a linear code C is a generator matrix of the dual code $C^\perp$, which means that a codeword c is ire C iff the matrix-vector product Hc=0. Then, the syndrome of the received word y=x+e is defined as S=Hy=H(x+e)=Hx+He=0+He=He. For GRS codes, it is useful to work with a syndrome that corresponds to a particular parity-check matrix. For $j \in \{0, \ldots, d-2\}$, let $S_j = S_j^{(y)} := (\tilde{a} \odot y)(\alpha^j)$. The syndrome polynomial associated with y is $S^{(y)}(X) := S_0 + S_1 X + \ldots + S_{d-2} X^{d-2}$. By the definition of a GRS code, the same syndrome polynomial is associated with e. In terms of syndromes, the main computation in decoding GRS codes is to determine polynomials $\omega(X), \sigma(X) \in \mathbb{F}_q[X]$, that satisfy the following equation, known as a key equation:

$$\omega \equiv S\sigma \bmod(X^{d-1}),$$

where $S=S^{(y)}$ is the syndrome polynomial, X is a free variable in the polynomial, $\omega(X) \in \mathbb{F}_q[X]$ is the error evaluator polynomial (EEP), defined by $\omega(X) := \Sigma_{i=1}^\varepsilon \beta_i \alpha_i \Pi_{j \neq i}(1-\alpha_j X)$, $\sigma(X) \in \mathbb{F}_{2^m}[X]$ is the error locator polynomial (ELP), defined by $\sigma(X) := \Pi_{i=1}^\varepsilon (1+\alpha_i X)$, where $\varepsilon \in \{1, \ldots, n\}$ is the number of errors, $\alpha_1, \ldots, \alpha_\varepsilon \in \mathbb{F}^*_q$ are the error locators, that is, field elements pointing to the location of the errors, $\beta_1, \ldots, \beta_\varepsilon \in \mathbb{F}^*_q$ are the corresponding error values, and $a_{i'} := \tilde{a}_{i'}$ for the $i' \in \{0, \ldots, n-1\}$ with $\alpha_i = \alpha^{i'}$.

The Berlekamp-Massey (BM) algorithm is an algorithm for decoding GRS codes that finds an estimated ELP $C(X) = 1 + C_1 X + C_2 X^2 + \ldots + C_L X^L$ which results in zero coefficients for $X^k$ in S(X)C(X) for k=L, ..., d−2 $S_k + C_1 S_{k-1} + \ldots + C_L S_{k-L} = 0$, where L is the number of errors found by the algorithm, N=d−1 is the total number of syndromes, $S_i$ is the coefficient of $X^i$ in the syndrome polynomial S(X) for all i, and k is an index that ranges from L to (N−1). Note that once the decoder has an estimate of the ELP, it can calculate an estimate of the EEP by the key equation. Note also that having both the ELP and the EEP, the decoder can find both the error locators and the error values, and therefore the error vector e itself, in the following way. The error locators are, by definition, the inverses of the roots of the EEP. The error values can be found using Forney's formula:

$$\beta_j = -\frac{\alpha_j}{a_j} \cdot \frac{\omega(\alpha_j^{-1})}{\sigma'(\alpha_j^{-1})}, j=1, \ldots, \varepsilon,$$

where for a polynomial $f(X) = \Sigma_{i=0}^m \gamma_i X^i$, $f'(X) := \Sigma_{i=1}^m i\gamma_i X^{i-1}$ is the formal derivative.

The BM algorithm begins by initializing C(X) to 1, L to zero; B(X) (a copy of the last C(X) since L was updated) to 1, b (a copy of the last discrepancy d since L was updated and initialized) to 1; and m (the number of iterations since L, B(X), and b were updated and initialized) to 1. The algorithm iterates from k=0 to N−1. At each iteration k of the algorithm, a discrepancy d is calculated:

$$d = S_k + C_j S_{k-1} + \ldots + C_L S_{s-L}.$$

If d is zero, C(X) and L are assumed correct for the moment, in is incremented, and the algorithm continues.

If d is not zero and 2L>k, C(X) is adjusted so that a recalculation of d would be zero;

$$C(X) = C(X) - (d/b) X^m B(X).$$

The $X^m$ term shifts B(X) to follow the syndromes corresponding to b. If the previous update of L occurred on iteration j, then m=k−j, and a recalculated discrepancy would be:

$$d = S_k + C_1 S_{k-1} + \ldots - (d/b)(S_j + B_1 S_{j-1} + \ldots).$$

This would change a recalculated discrepancy to: d=d−(d/b)b=d−d=0. Then, m is incremented, and the algorithm continues.

On the other hand, if d is not zero and 2L≤n, a copy of C is saved in vector T, C(X) is adjusted as above, B is updated from T, L is reset to (k+1−L), the discrepancy d is saved as b, in is reset to 1, and the algorithm continues.

A Chien search is an algorithm for determining roots of polynomials over a finite field, such as ELPs encountered in decoding GRS codes. Let a be a primitive element of a finite field. Chien's search tests the non-zero elements in the field in the generator's order $\alpha^0, \alpha^1, \alpha^2, \ldots$. In this way, every non-zero field element is checked. If at any stage the resultant polynomial evaluates to zero, then the associated element is a root.

Hard information for a received symbol in $\mathbb{F}_q$ is the estimated symbol value, i.e., one of $0, 1, \alpha, \ldots, \alpha^{q-2}$, while "soft information" includes both an estimated value and the reliability of this estimation. This reliability may take many forms, but one common form is the probability, or an estimation of this probability, that the estimation is correct, possibly plus a subset of $F_q$ of the most probable alternative estimates for the received symbol. For example, if symbols of the GRS code are mapped to Quadrature Amplitude Modulation (QAM) symbols and transmitted through an Additive White Gaussian Noise (AWGN) channel, then the typical hard information may be obtained from the closest QAM symbol to the received coordinate, while for soft information, the reliability can be obtained by some decreasing function of the distance between the received coordinate and the closest QAM symbol, and the subset of $F_q$ of the most probable alternative estimates may be, e.g., the symbols corresponding to the $2^{nd}$, $3^{rd}$, . . . , M-th (for some M≤q), closest QAM symbols to the received coordinate.

In hard-decision (HD) decoding, the hard-information vector (per-coordinate symbol estimates) is used as the input of an error-correcting code (ECC) decoder, while in soft-decision (SD) decoding, a soft information vector, e.g., per-coordinate reliability vector and, for each coordinate that is considered unreliable, a subset of $F_q$ consisting of the most probable alternative estimates, on top of the hard-information vector, is used as the input of the ECC decoder.

As another example, in generalized concatenated coding schemes that may be employed in flash-memory controllers, decoders of per-row binary codes may return estimated symbols for GRS codes that work between different rows. In such a case, each per row binary decoder may output a single estimated GRS symbol or an indication of erasure in case of HD decoding, while SD decoding of the per-row binary codes may result in SD information for the inter-row GRS codes. In the case of a single-level cell (SLC) flash memory, in which each cell stores a single bit, hard information for the per-row binary codes is obtained with a single read (single threshold), while increasingly refined soft information is obtained from additional reads.

Symbols with a high enough reliability may be considered "strong", while the remaining symbols may be considered "weak".

Chase decoding is a simple and general method for SD decoding for both binary and non-binary codes. See D. Chase, "A Class of Algorithms for Decoding Block Codes With Channel Measurement Information", IEEE Trans, inform. Theory, Vol. IT-18, pp. 170-182, January 1972, the contents of which are herein incorporated by reference in their entirety. In its simplest form, in case of HD decoding failure, "soft" reliability information is used to distinguish between reliable and non-reliable coordinates of a received word. The decoder then tries to replace the symbols on the weak coordinates by the symbol-vectors in some pre-defined list. For each such replacement, the decoder performs HD decoding. If the number of errors on the reliable coordinates is not above the HD decoding radius of the code and the hypothesized replacement vector is close enough to the transmitted vector on the non-reliable coordinates, in terms of Hamming distance, then HD decoding will succeed.

Consider now two replacement vectors that differ on a single coordinate. In a naïve application of Chase decoding, the similarity between these two replacement vectors is ignored, and two applications of HD decoding are required. In fast Chase decoding, intermediate results from the HD decoding of the first pattern are saved, and used to significantly reduce the complexity of HD decoding of the second, almost identical, pattern.

Recently, Wu, "Fast Chase decoding algorithms and architectures for Reed-Solomon codes", *IEEE Trans. Inform. Theory*, vol. 58, no. 1, pp. 109-129, January 2012, the contents of which are herein incorporated by reference in their entirety, hereinafter Wu2012, introduced a new fast Chase decoding algorithm for Reed-Solomon (RS) codes for the case where the HD decoder is based on the Berlekamp-Massey (BM) algorithm. The basic form of Wu's algorithm enables avoiding multiple applications of the BM algorithm, but still requires an exhaustive root search, such as a Chien search, for each replacement vector. To avoid also unnecessary Chien searches, Wu suggests a stopping criterion for significantly reducing the probability of an unnecessary Chien search, while never missing the required Chien search, at the cost of slightly degrading the performance. However, Wu's method is conceptually complicated. There are 8 distinct cases to consider, and a considerable modification is required for working in the frequency domain, as an alternative method for avoiding Chien searches, etc. In addition, Wu's method is not capable of handling the case where the total number of errors is larger than d−1.

SUMMARY

Exemplary embodiments of the disclosure provide a new fast Chase algorithm for generalized RS (GRS) codes for syndrome-based HD decoders. The new decoder is conceptually simpler than Wu's, and is based on two applications of Koetter's algorithm for each additional modified symbol. Also, the new decoder is automatically suitable for application in the frequency domain, by tracking evaluation vectors of both a polynomial and its formal derivative. Embodiments of the disclosure also provide a new stopping criterion for avoiding unnecessary Chien searches in a fast Chase algorithm according to an embodiment. An embodiment of an algorithm is somewhat more complicated than Wu's algorithm, but, as opposed to Wu's algorithm, is capable of working when the total number of errors is strictly larger than d−1, where d is the minimum distance of the decoded GRS code. Another embodiment of an algorithm works when the total number of errors is smaller than d−1 and has a complexity similar to that of Wu's algorithm".

According to an embodiment of the disclosure, there is provided an application specific integrated circuit (ASIC) tangibly encoding a program of instructions executable by the integrated circuit to perform a method for fast Chase decoding of generalized Reed-Solomon (GRS) codes. The method includes using outputs of a syndrome-based hard-decision (HD) algorithm to find an initial Groebner basis $G=\{g_0=(g_{00}, g_{01}), g_1=(g_{10}, g_{11})\}$ for a solution module of a key equation, upon failure of RD decoding of a GRS codeword received by the ASIC from a communication channel; traversing a tree of error patterns in $$E_{i_1} \times \ldots \times E_{i_{n_0}}$$

on a plurality of unreliable coordinates to adjoin a next weak coordinate wherein $n_0$ is a number of the unreliable coordinates, $i_1, \ldots, i_{n_0}$ are the unreliable coordinates, vertices of the tree of error patterns correspond to error patterns, and edges connect a parent error pattern to a child error pattern having exactly one additional non-zero value, to find a Groebner basis $G^+$ for each adjoining error location; and outputting an estimated transmitted codeword $\hat{x}:=y+\hat{e}$ when correct error vector ê has been found.

According to a further embodiment of the disclosure, the syndrome-based HD algorithm is selected from a group that includes the Berlekamp-Massey (BM) algorithm and Fitzpatrick's algorithm.

According to a further embodiment of the disclosure, finding an initial Groebner basis G includes defining polynomials $b_1:=(S\sigma \bmod X^{d-1}, \sigma)$, and $b_2$ $(SX^mB \bmod X^{d-1}, X^mB)$, wherein S is the syndrome polynomial, $\sigma$ is the estimated ELP output by the BM algorithm, m is the number of iterations since the last linear feedback shift register (LFSR) length change in the BM algorithm, and B is a polynomial output from the BM algorithm that is a copy of the last estimated ELP $\sigma$ before the LFSR length L was updated; and outputting one of (1) $c\{b_1, b_2\}$ as the Groebner basis when leading monomials of $b_1$ and $b_2$ contain distinct unit vectors, for a non-zero constant c; (2) $\{d(b_1-cX^1b_2), db_2\}$ as the Groebner basis when the leading monomials contain a same unit vector and the leading monomial of $b_1$ is at least as large as that of $b_2$, wherein $c \in K^*$ and $l \in N$ are chosen such that the leading monomial of $b_2$ is canceled and d is a non-zero constant, or (3) $\{db_1, d(b_2-cX^1b_1)\}$ as the Groebner basis when the leading monomials contain the same unit vector and the leading monomial of $b_2$ is strictly larger than that of $b_1$, wherein $c \in K^*$ and $l \in N^*$ are chosen such that the leading monomial of $b_2$ is canceled and d is a non-zero constant.

According to a further embodiment of the disclosure, traversing a tree of error patterns to find a Groebner basis $G^+$ for each adjoining error location includes calculating a root discrepancy $\Delta_j^{rt}:=g_{j1}(\alpha_r^{-1})$ for j=0 and 1, wherein $g_0=(g_{00}(X), g_{01}(X))$ and $g_1=(g_{10}(X), g_{11}(X))$ constitute a current Groebner basis and $\alpha_r$ is a next error location and r is a number of error locations; setting, when a set $$J := \{j \in \{0, 1\} \mid \Delta_j^{rt} \neq 0\} \neq \emptyset, g_j^+ := c\left(g_j - \frac{\Delta_j^{rt}}{\Delta_{j^*}^{rt}} g_{j^*}\right)$$

when (j≠j*), wherein j*∈J is such that a leading monomial of $g_{j^*}$ is a minimum leading monomial of $(g_j)$ for all j∈J and c is a non-zero constant, or $g^+_j:=c(X-\alpha_r^{-1})g_{j^*}$ when j=j*, wherein X is a free variable; setting $g_j:=g^+_j$ for j=0 and 1; calculating a derivative discrepancy $\Delta_j^{der}:=\beta_r\alpha_r g'_{j1}(\alpha_r^{-1})+\alpha_r g_{j0}(\alpha_r^-)$ for j=0 and 1, wherein $\beta_r$ is a value of location $\alpha_r$, and $g'_{j1}(X)$ is a formal derivative of $g_{j1}(X)$; setting, when a set $$J := \{j \in \{0, 1\} \mid \Delta_j^{der} \neq 0\} \neq \emptyset, g_j^+ := c\left(g_j - \frac{\Delta_j^{der}}{\Delta_{j^*}^{der}} g_{j^*}\right)$$

when (j≠j), wherein j*∈J is such that a leading monomial of $M(g_{j^*})$=a minimum leading monomial of $(g_j)$ for j∈J and c is a non-zero constant, or $g^+_j:=c(X-\alpha_r^{-1})g_{j^*}$ when j=j*.

According to a further embodiment of the disclosure, the method includes, when set $J:=\{j\in\{0,1\}|\Delta_j^{rt}\neq 0\}=\emptyset$ or when set $J:=\{j\in\{0,1\}\Delta_j^{der}\neq 0\}=\emptyset$, setting $g^+_j:=g_j$ for j=0, 1, where $g^+_0=(g^+_{00}, g^+_{01})$ and $g^+_1=(g^+_{10}, g^+_{11})$ is a Groebner basis $G^+$ for the next error locator.

According to a further embodiment of the disclosure, the method includes determining whether a root discrepancy is zero for j=1 and a derivative discrepancy is zero for j=1, and stopping setting of $g^+_j$, if it is determined that both the root discrepancy and the derivative discrepancy are zero for j=1.

According to a further embodiment of the disclosure, the method includes tracking a degree of Groebner basis function $g_{00}$ with a variable $d_0$ by increasing $d_0$ by 1 whenever j*=0.

According to a further embodiment of the disclosure, the method includes tracking two polynomials $g_{01}(X)$, $g_{11}(X)$; and calculating, $g_{j0}(\alpha_r^{-1})$ by using the key equation for j=0, 1.

According to a further embodiment of the disclosure, calculating $g_{j0}(\alpha_r^{-1})$ includes calculating and storing, for k=2t−δ−1 to 2t−2, $\tilde{B}_{k+1}=\alpha_r^{-1}\cdot\tilde{B}_k-(g_{j1})_{2t-1-k}$ and result=result+$S_{k+1}\tilde{B}_{k+1}$, wherein $\delta:=\deg(g_{j1})$, $\tilde{B}_k$ is initialized to 0, $(g_{j1})_m$ is a coefficient of $X^m$ in $g_{j1}$, result is initialized to 0, and $S_{k+1}$ is a coefficient of the syndrome polynomial; updating result=result·$(\alpha_r^{-1})^{2t}$; and outputting result. The steps of calculating and storing, for k=2t−δ−1 to 2t−2, $\tilde{B}_{k+1}$ and result, updating result and outputting result are performed while adjoining the next weak coordinate $\alpha_r$.

According to a further embodiment of the disclosure, the method includes calculating and storing $(\alpha_m^{-1})^{2t}$ for all weak coordinates $\alpha_m$, wherein $t=\lfloor(d-1)/2\rfloor$ is an error correction radius of a GRS code of designed distance d.

According to another embodiment of the disclosure, there is provided a non-transitory program storage device readable by a computer, tangibly embodying a program of instructions executed by the computer to perform the method steps for fast Chase decoding of generalized Reed-Solomon (GRS) codes.

DETAILED DESCRIPTION OF EXEMPLARY EMBODIMENTS

Exemplary embodiments of the invention as described herein generally provide systems and methods for performing fast Chase decoding of generalized Reed-Solomon codes. While embodiments are susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

I. Overview

Embodiments of the disclosure use a combination of a syndrome-based hard decision algorithm, such as the Berlekamp-Massey algorithm, and Koetter's algorithm for fast Chase decoding of generalized Reed-Solomon codes, and therefore also for fast Chase decoding of their subfield subcodes. Ira case of hard-decision decoding failure, an algorithm according to an embodiment begins by finding a Groebner basis for the solution module of the key equation. This Groebner basis can be obtained from the existing outputs of the Berlekamp-Massey algorithm, or alternatively, the Euclidean algorithm or Fitzpatrick's algorithm (see P. Fitzpatrick, "On the key equation," *IEEE Trans. Inform. Theory*, vol. 41, no. 5, pp. 1290-1302, September 1995, the contents of which are herein incorporated by reference in their entirety, hereinafter Fitzpatrick) may be used. Then, the above Groebner basis is used as an initial value in Koetter's algorithm, as described, e.g., in R. J. McEliece, "The Guruswami-Sudan decoding algorithm for Reed-Solomon codes," IPN Progress Report, vol. 42-153, May 2003, the contents of which are herein incorporated by reference in their entirety. This leads to a tree-based Chase scheduling. Modifying an unmodified coordinate in the received vector amounts to 2 updates in Koetter's algorithm, and does not require updating syndromes. An algorithm according to an embodiment uses the same number of finite-field multiplications per iteration as Wu's algorithm, but it is conceptually simpler.

2. Preliminaries

Let q be a prime power, and let $F_q$ be the finite field q elements. Consider a primitive generalized Reed-Solomon (GRS) code, C, of length n:=q−1 and designed distance d∈N*, d≥2, where N* is the set of positive integers. Since the most general GRS code can be obtained by shortening a primitive GRS code, there is no loss of generality in considering only primitive GRS codes. In detail, let $\tilde{a}=(\tilde{a}_0, \ldots, \tilde{a}_{n-1}) \in (F^*_q)^n$ be a vector of non-zero elements. For a vector $f=(f_0, f_1, \ldots, f_{n-1}) \in F_q^n$, let $f(X):=f_0 + f_1 X + \ldots + f_{n-1} X^{n-1} \in F_q[X]$. Now $C \subseteq F_q^n$ is defined as the set of all vectors $f \in F_q^n$ for which $\tilde{a}(X) \odot f(X)$ has roots $1, \alpha, \ldots, \alpha^{d-2}$ for some fixed primitive $\alpha \in \mathbb{F}_q$, where (-⊙-) stands for coefficient-wise multiplication of polynomials: for $f(X) = \Sigma_{i=0}^r f_i X^i$ and $g(X) = \Sigma_{i=0}^s g_i X^i$, let m:=min{r, s}, and define $f(X) \odot g(X) := \Sigma_{i=0}^m f_i g_i X^i$.

To recall the key equation, suppose that a codeword x∈C is transmitted, and the received word is y:=x+e for some error vector $e \in F_q^n$. For j∈{0, . . . , d−2}, let $S_j = S_j^{(y)} := (\tilde{a} \odot y)(\alpha^j)$. The syndrome polynomial associated with y is $S^{(y)}(X) := S_0 + S_1 X + \ldots + S_{d-2} X^{d-2}$. By the definition of the GRS code, the same syndrome polynomial is associated with e.

If $v \in F_q^n$ is such that $v(X) = X^i$ for some i∈{0, . . . , n−1}, then $S_j^{(v)} = (\tilde{a} \odot v)(\alpha^j) = \tilde{a}_i (\alpha^i)^j$, so that $$S^{(v)}(X) = \tilde{a}_i (1 + \alpha^i X + \ldots + (\alpha^i)^{d-2} X^{d-2}) \equiv \frac{\tilde{a}_i}{1 - \alpha^i X} \mod(X^{d-1}),$$

So, if the error locators are some distinct elements $\alpha_1, \ldots, \alpha_\varepsilon \in \mathbb{F}^*_q$, where ε∈{1, . . . , n} is the number of errors, and the corresponding error values are $\beta_1, \ldots, \beta_\varepsilon \in \mathbb{F}^*_q$, then $$S^{(y)}(X) \equiv \sum_{i=1}^{\varepsilon} \frac{\beta_i a_i}{1 - \alpha_i X} \mod(X^{d-1}), \quad (1)$$

where $a_i := \tilde{a}_{i'}$, for the i'∈{0, . . . , n−1} with $\alpha_i = \alpha^{i'}$.

Defining the error locator polynomial, $\sigma(X) \in F_q[X]$, by $$\sigma(X) := \Pi_{i=1}^{\varepsilon}(1 - \alpha_i X),$$

and the error evaluator polynomial, $\omega(X) \in F_q[X]$, by $$\omega(X) := \Sigma_{i=1}^{\varepsilon} \alpha_i \beta_i \Pi_{j \neq i}(1 - \alpha_j X),$$

it follows from EQ. (1) that $$\omega \equiv S^{(y)} \sigma \mod(X^{d-1}). \quad (2)$$

EQ. (2) is the so-called key equation.

Let $$M_0 = M_0(S^{(y)}) := \{(u,v) \in F_q[X]^2 | u \equiv S^{(y)} v \mod(X^{d-1})\}.$$

be the solution module of the key equation. Next, recall that if the number of errors in y is up to t:=⌊(d−1)/2⌋, then (ω, σ) is a minimal element in $M_0$ for an appropriate monomial ordering on $F_q[X]^2$, in fact, it is the unique minimal element $(u,v) \in M_0$ with v(0)=1—see ahead for details. The monomial ordering of the following definition is the special case of the ordering $<_r$ corresponding to r=−1 of Fitzpatrick. If a pair (f(X), g(X)) is regarded as the bivariate polynomial f(X)+Yg(X), then this ordering is also the (1, −1)-weighted-lex ordering with Y>X Definition 2.1: Define the following monomial ordering, <, on $F_q[X]^2$:

$(X^i, 0) < (X^j, 0)$ iff $i < j$; $(0, X^i) < (0, X^j)$ iff $i < j$; $(X^i, 0) < (0, X^j)$ iff $i \leq j-1$.

The following proposition is a special case of Thm. 3.2 of Fitzpatrick. Its proof is included herein for completeness. Unless noted otherwise, LM(u,v) will stand for the leading monomial of (u,v) with respect to the above monomial ordering, <, and a "Groebner basis" will stand for a Groebner basis with respect to <. Note that in the following proposition, $d_H(y,x)$ represents the Hamming distance between vectors y and x.

Proposition 2.2: Using the above notation, suppose that $d_H(y,x) \leq t$. Let $(u,v) \in M_0(S^{(y)}) \setminus \{(0, 0)\}$ satisfy LM(u,v)≤LM(ω, σ). Then there exists some scalar $c \in F^*_q$ such that $(u,v) = c \cdot (\omega, \sigma) = (c \cdot \omega(X), c \cdot \sigma(X))$. Hence, (ω, σ) is the unique minimal element (u,v) in $M_0$ with v(1)=1.

Proof. First, note that if there exist (ũ, ṽ), $(u,v) \in M_0(S^{(y)})$ and $d_1, d_2 \in N$ with $d_1 + d_2 < d-1$, gcd(ũ, ṽ)=1, deg(u), deg(ũ)≤$d_1$, and deg(v), deg(ṽ)≤$d_2$, then there exists a polynomial $f \in \mathbb{F}_q[X]$ such that $(u,v) = f \cdot (\tilde{u}, \tilde{v})$. To see this, note that from $u \equiv S^{(y)} v \mod(X^{d-1})$ and $\tilde{u} \equiv S^{(y)} \tilde{v} \mod(X^{d-1})$, it follows that $u\tilde{v} \equiv \tilde{u}v \mod(X^{d-1})$. In view of the above degree constraints, the last congruence implies $u\tilde{v} = \tilde{u}x$. Since gcd(ũ, ṽ)=1, it follows that ũ|u, ṽ|v, and u/ũ=v/ṽ. This establishes the claim.

Now let $(u,v) \in M_0(S^{(y)})$, and note that gcd(ω, σ)−1. If deg(v)>t≥deg(σ), then clearly LM(u,v)>LM(ω, σ)=(0, $X^{deg(\sigma)}$). Similarly, if deg(u)>t−1≥deg(σ)−1, then LM(u,v)>LM(ω, σ). Hence, it may be assumed without loss of generality that deg(v)≤t and deg(u)≤t−1. The above claim then shows that (u,v)=f·(ω, σ) for some, $F \in F_q[X]$. If LM(u, v)≤LM(ω, σ), this must imply that f is a constant, as required. This also shows that LM(u,v)=LM(ω, σ).

It will also be useful to recall that the uniqueness in the previous proposition is an instance of a more general result:

Proposition 2.3: For a field K and for l∈N*, let < be any monomial ordering on $K[X]^l$, and let $M \subseteq K[X]^l$ be any K[X]-submodule. Suppose that both f:=$(f_1(X), \ldots, f_l(X)) \in M \setminus \{0\}$ and g:=$(g_1(X), \ldots, g_l(X)) \in M \setminus \{0\}$ have the minimal leading monomial in M\{0}. Then there exists a c∈K* such that f=c·g.

Proof Suppose not. Since LM(f)=LM(g), there exists a constant c∈K* such that the leading monomial cancels in h:=f−cg. By assumption, h≠0, and LM(h)<LM(f), which is a contradiction.

3 Main Result

An observation according to an embodiment is that the LFSR minimization task A[$\sigma_i$], disclosed on page 112 of Wu2012, incorporated above, does not define a module, and can be replaced by a module minimization task. The possibility of using Koetter's algorithm as an alternative to Wu's method follows almost immediately from the following theorem.

Theorem 3.1: For $r \in \mathbb{N}$, $r \le n$, for distinct $\alpha_1, \ldots, \alpha_r \in F^*_q$, and for $\beta_1, \ldots, \beta_r \in F^*_q$, let $$M_r = M_r(S^{(y)}, \alpha_1, \ldots, \alpha_r, \beta_1, \ldots, \beta_r)$$

be the set of all pairs $(u,v) \in F_q[X]^2$ satisfying the following conditions:

1. $u \equiv S^{(y)} v \mod(X^{d-1})$
2. $\forall j \in \{1, \ldots, r\}$, $v(\alpha_j^{-1}) = 0$ and $\beta_j \alpha_j v'(\alpha_j^{-1}) = -\alpha_j u(\alpha_j^{-1})$ with $\alpha_j := \tilde{a}_{j'}$ for the $j'$ with $\alpha_j = \alpha_{j'}$.

Then

1. $M_r$ is a $K[X]$-module.
2. If $d_H(y,x) = t + r$, $\alpha_j, \ldots, \alpha_r$ are error locations and $\beta_1, \ldots, \beta_r$ are the corresponding error values, then $LW(\omega, \sigma) = \min \{LM(u,v) | (u,v) \in M_r \setminus \{0\}\}$.

Proof 1. Clearly, $M_r$ is an $F_q$-vector space. For $f(X) \in F_q[X]$ and $(u,v) \in M_r$, it needs to be shown that $f \cdot (u,v) \in M_r$. Clearly, $(fu, fv)$ satisfies the required congruence, and also $fv$ has the required roots. It remains to verify that for all $j$, $\beta_j \alpha_j (fv)'(\alpha_j^{-1}) = \alpha_j (fu)(\alpha_j^{-1})$. Now, $$(fv)'(\alpha_j^{-1}) = (f'v)(\alpha_j^{-1}) + (fv')(\alpha_j^{-1}) =$$

$$(fv')(\alpha_j^{-1}) = f(\alpha_j^{-1}) \cdot \frac{-\alpha_j}{\beta_j a_j} u(\alpha_j^{-1}) = -\frac{\alpha_j}{\beta_j a_j}(fu)(\alpha_j^{-1}),$$

where in the second equation $v(\alpha_j^{-1}) = 0$ was used, and in the third equation $\beta_j \alpha_j v'(\alpha_j^{-1}) = \alpha_j u(\alpha_j^{-1})$ was used (note that $\beta_j \alpha_j \ne 0$).

2. The proof is by induction on $r$. For $r = 0$, the assertion is just Proposition 2.2, Suppose that $r \ge 1$, and the assertion holds for $r - 1$. Let $\tilde{y}$ be obtained from $y$ by subtracting $\beta_r$ from coordinate $\alpha_r$. Let $\tilde{\sigma} := \sigma/(1 - \alpha_r X)$, the error locator for $\tilde{y}$, and let $\tilde{\omega}$ be the error evaluator for $\tilde{y}$. By the induction hypothesis, $$LM(\tilde{\omega}, \tilde{\sigma}) = \min\{LM(u,v) | (u,v) \in M_{r-1}\} \quad (3)$$

with $$M_{r-1} := M_{r-1}(S^{(\tilde{y})}, \alpha_1, \ldots, \alpha_{r-1}, \beta_1, \ldots, \beta_{r-1}).$$

The following lemma will be useful.

Lemma: For $(u,v) \in M_r$, write $\tilde{v} := v/(1 - \alpha_r X)$ and put $h := u - \beta_r \alpha_r \tilde{v}$. Then $(1 - \alpha_r X) | h(X)$. Moreover, writing $\tilde{h} := h/(1 - \alpha_r X)$, the map $\psi: (u,v) \to (\tilde{h}, \tilde{v})$ maps $M_r$ into $M_{r-1}$, and satisfies $\psi(\omega, \sigma) = (\tilde{\omega}, \tilde{\sigma})$.

Proof of Lemma. Since $v = (1 - \alpha_r X) \tilde{v}$, we get $v' = -\alpha_r \tilde{v} + (1 - \alpha_r X)\tilde{v}'$, and therefore $v'(\alpha_r^{-1}) = -\alpha_r \tilde{v}(\alpha_r^{-1})$. Hence, $$h(\alpha_r^{-1}) = u(\alpha_r^{-1}) - \beta_r \alpha_r \tilde{v}(\alpha_r^{-1}) = -\frac{\beta_r a_r}{\alpha_r} v'(\alpha_r^{-1}) - \beta_r a_r \tilde{v}(\alpha_r^{-1}) = 0,$$

which proves the first assertion.

For the second assertion, note first that $$S^{(\tilde{y})} \equiv S^{(y)} - \frac{\beta_r a_r}{1 - \alpha_r X} \mod(X^{d-1}),$$

and therefore $$S^{(\tilde{y})} \tilde{v} \equiv S^{(y)} \tilde{v} - \frac{\beta_r a_r}{1 - \alpha_r X} \tilde{v} =$$

$$\frac{1}{1 - \alpha_r X}(S^{(y)} v - \beta_r a_r \tilde{v}) \equiv \frac{1}{1 - \alpha_r X}(u - \beta_r a_r \tilde{v}) = \tilde{h},$$

where "$\equiv$" stands for congruence modulo $X^{d-1}$, which implies that $(\tilde{h}, \tilde{v})$ satisfies the required congruence relation in the definition of $M_{r-1}$. Also, clearly $\tilde{v}(\alpha_j^{-1}) = 0$ for all $j \in \{1, \ldots, r-1\}$. Finally, using $v' = -\alpha_r \tilde{v} + (1 - \alpha_r X)\tilde{v}'$ again, it can be seen that for all $j \in \{1, \ldots, r-1\}$, $$\tilde{v}'(\alpha_j^{-1}) = \frac{v'(\alpha_j^{-1})}{1 - \alpha_r \alpha_j^{-1}} = -\frac{\alpha_j}{\beta_j a_j} \cdot \frac{u(\alpha_j^{-1})}{1 - \alpha_r \alpha_j^{-1}} = -\frac{\alpha_j}{\beta_j a_j} \cdot \tilde{h}(\alpha_j^{-1}).$$

This proves that $\psi$ maps $M_r$ into $M_{r-1}$.

Finally, $\psi(\omega, \sigma) = (\tilde{h}, \tilde{\sigma})$ with $\tilde{h} = (\omega - \beta_r \alpha_r \tilde{\sigma})/(1 - \alpha_r X)$, and it is straightforward to verify that $\tilde{h} = \tilde{\omega}$. In detail, for $\varepsilon := t + r$, let $\alpha'_1, \ldots, \alpha'_\varepsilon \in F^*_q$ be some enumeration of the error locators, let $\beta'_1, \ldots, \beta'_\varepsilon \in F^*_q$ be the corresponding error values, and let $a'_1, \ldots, a'_\varepsilon$ be the corresponding entries of the vector it $\underline{\alpha}$. Assume without loss of generality that $\alpha'_\varepsilon = \alpha_r$, and hence $\beta'_\varepsilon = \beta_r$. It follows that $$\tilde{h} = \frac{\omega - \beta_r a_r \tilde{\sigma}}{1 - \alpha_r X}$$

$$= \frac{1}{1 - \alpha'_\varepsilon X}\left(\sum_{i=1}^{\varepsilon} \beta'_i a'_i \prod_{j=1, j \ne i}^{\varepsilon} (1 - \alpha'_j X) - \beta'_\varepsilon a'_\varepsilon \prod_{j=1}^{\varepsilon-1}(1 - \alpha'_j X)\right)$$

$$= \frac{1}{1 - \alpha'_\varepsilon X}\left(\sum_{i=1}^{\varepsilon-1} \beta'_i a'_i \prod_{j=1, j \ne i}^{\varepsilon}(1 - \alpha'_j X)\right)$$

$$= \sum_{i=1}^{\varepsilon-1} \beta'_i a'_i \prod_{j=1, j \ne i}^{\varepsilon-1}(1 - \alpha'_j X) = \tilde{\omega}.$$

This concludes the proof of the lemma.

Returning to the proof of the theorem, if $(u,v) \in M_r$ and $v = c \cdot \sigma$ for some $c \in F^*_q$, then $LM(u,v) \ge (0, X^{\deg(\sigma)}) = LM(\omega, \sigma)$. Let $(u,v) \in M_r \setminus \{0\}$ be such that $v \ne c \sigma$ for all $c \in F^*_q$. Then, $\psi(u,v) \ne c(\tilde{\omega}, \tilde{\sigma})$ for all $c \in F^*_q$, and hence $$LM(\psi(u,v)) > LM(\tilde{\omega}, \tilde{\sigma}) = (0, X^{\deg(\tilde{\sigma})-1}), \quad (4)$$

where the inequality can be obtained by the induction hypothesis and Proposition 2.3. If the leading monomial of $\psi(u,v)$ is of the form $(0, X^j)$ for some $j$, then $LM(\psi(u,v)) = (0, X^{\deg(v)-1})$, and EQ. (4) implies $\deg(v) > \deg(\sigma)$, so that certainly $LM(u,v) > LM(\Omega, \sigma)$.

Suppose therefore that $LM(\psi(u,v))$ is of the form $(X^j, 0)$ for some $j$, that is, $LM(\psi(u,v)) = (X^{\deg(\tilde{h})-1}, 0)$. In this case, EQ. (4) implies that $\deg(\tilde{h}) - 1 > \deg(\tilde{\sigma}) - 2$, that is, $\deg(\tilde{h}) \ge \deg(\tilde{\sigma})$. But since $\tilde{h} = u - \beta_r \alpha_r \tilde{v}$, this implies that at least one of $u$ and $\tilde{v}$ must have a degree that is at least as large as $\deg(\sigma)$. Now, if $\deg(u) \ge \deg(\sigma)$, that is, if $\deg(u) > \deg(\sigma) - 1$, then $LM(u,v) > LM(\omega, \sigma) = (0, X^{\deg(\sigma)})$. Similarly, if $\deg(\tilde{v}) \ge \deg(\tilde{\sigma})$, then $\deg(v) > \deg(\sigma)$, and again $LM(u,v) > LM(\omega, \sigma)$. This completes the proof.

Using the terminology of Theorem 3.1, for a pair $(u(X), v(X)) \in M_{r-1}$, embodiments define the r-th root condition on $(u,v)$ as $v(\alpha_r^{-1}) = 0$, so that the root condition on $(u,v)$ involves only $v$, and the r-th derivative condition as $\beta_r \alpha_r v'(\alpha_r^{-1}) = -\alpha_r u(\alpha_r^{-1})$. The above pair $(u,v)$ is in $M_r \subset M_{r-1}$ iff it satisfies both the r-th root condition and the r-th derivative condition. When moving from $M_j$ to $M_{j+1}$, two additional functionals are zeroed. It was already proved in the theorem that each $M_j$ is a K[X]-module. Also, the intersection of $M_j$ with the set of pairs (u, v) for which $v(\alpha_{j+1}^{-1})=0$ is clearly a K[X]-module. Hence, if each "root condition" comes before the corresponding "derivative condition," two iterations of Koetter's algorithm can be used to move from a Groebner basis for $M_j$ to a Groebner basis for $M_{j+1}$.

Remark: Note that for all r, $M_r$ is free of rank 2. First, since $M_r$ is a submodule of $K[X]^2$, it is free of rank at most 2, a submodule of a free module over a principle ideal domain. Also, since both $(X^{d-1}(1-\alpha_1 X) \ldots (1-\alpha_r X), 0)$ and $(\omega, \sigma)$ are in $M_r$, the rank is at least 2.

4 Koetter's Iterations for Chase Updates

A description of Koetter's iteration is presented in Appendix, below. Using the terminology of the appendix, in the current context l=1, and, as already mentioned, there are two types of Koetter iterations: one for a root condition, and the other for a derivative condition. For a fair comparison with Algorithm 1 of Wu2012, the version of Koetter's iteration presented herein does include inversions, in this version, the right-hand sides of the update rules are both divided by $\Delta_{j*}$. Recall that multiplication of elements by non-zero constants takes a Groebner basis to a Groebner basis.

In the r-th root iteration, the linear functional D acts on a pair (u,v) as $D(u,v)=v(\alpha_r^{-1})$, and hence on $X \cdot (u,v)$ as $D(X \cdot (u,v))=\alpha_r^{-1} D(u,v)$. In the r-th derivative iteration, which comes after the r-th root iteration, $$D(u,v) = \beta_r \alpha_r v'(\alpha_r^{-1}) + \alpha_r u(\alpha_r^{-1}),$$

and therefore also $$D(X \cdot (u, v)) = \beta_r a_r (Xv)'(\alpha_r^{-1}) + a_r (Xu)(\alpha_r^{-1})$$
$$= \beta_r a_r \alpha_r^{-1} v'(\alpha_r^{-1}) + u(\alpha_r^{-1}) = \alpha_r^{-1} D(u, v),$$

where $(Xv)'=Xv'+v$ was used in the second equality and $v(\alpha_r^{-1})=0$. So, for both types of iterations, root condition and derivative condition, $D(X \cdot (u,v))/D(u,v)=\alpha_r^{-1}$ if $D(u,v) \neq 0$. Hence, the iteration corresponding to a single location $\alpha_r$ has the following form.

Figure 1:
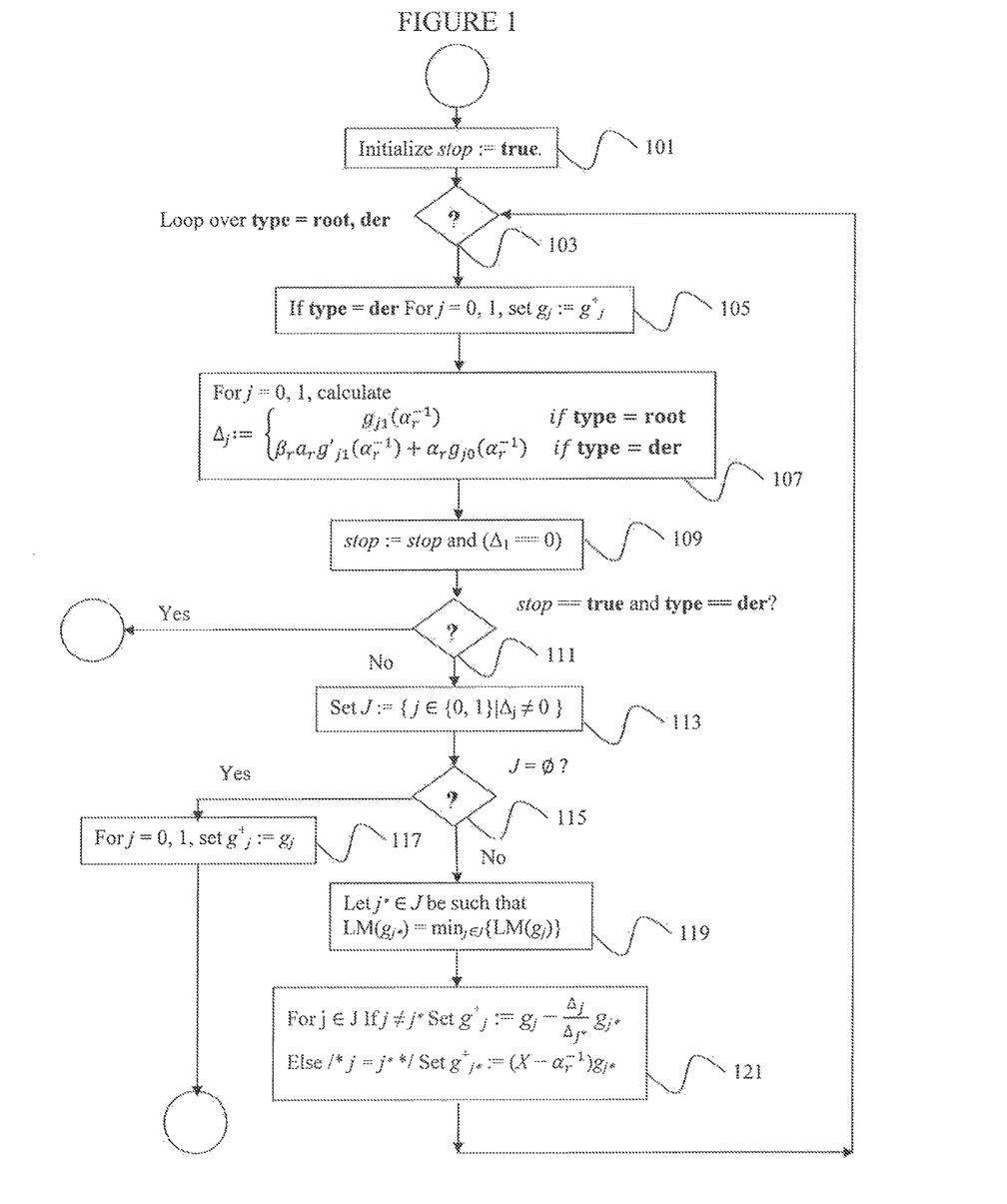
FIG. 1 is a flowchart of Koetter's iterative algorithm for adjoining error locations, according to embodiments of the disclosure.

Algorithm A: Koetter's Iteration for Adjoining Error Location $\alpha_r$:

FIG. 1 is a flowchart of Koetter's iterative algorithm for adjoining error locations, according to embodiments of the disclosure.

Input: A Groebner basis $G=\{g_0=(g_{00}, g_{01}), g_1=(g_{10}, g_{11})\}$ for $M_{r-1}(S^{(y)}, \alpha_1, \ldots, \alpha_{r-1}, \beta_1, \ldots, \beta_{r-1})$, with $LM(g_j)$ containing the j-th unit vector for $j \in \{0, 1\}$ The next error location, $\alpha_r$, and the corresponding error value, $\beta_r$.

Output: A Groebner basis $G^+\{g^+_0=(g^+_{00}, g^+_{01})), (g^+_{10}, g^+_{11})\}$ for $M_r(S^{(y)}, \alpha_j, \ldots, \alpha_r, \beta_j, \ldots, \beta_r)$ with $LM(g^+_j)$ containing the j-th unit vector for $j \in \{0, 1\}$ Algorithm, with references to the flowchart of FIG. 1:

```
Initialize stop := true                        // Step 101
For type = root, der                           // Step 103
   If type = der Then                          // Step 105
      For j = 0, 1, set g_j := g_j^+           // initiate with output of root step
   For j = 0, 1, calculate                     // Step 107
```

$$\Delta_j := \begin{cases} g_{j1}(\alpha_r^{-1}) & \text{if type = root} \\ \beta_r a_r g'_{j1}(\alpha_r^{-1}) + \alpha_r g_{j0}(\alpha_r^{-1}) & \text{if type = der} \end{cases}$$

```
stop := stop and (Δ_1 == 0))                   // Step 109
if type == der and stop == true, exit
                                               // Step 111, stopping criteria, described below
Set J := {j ∈ {0, 1}|Δ_j ≠ 0}                  // Step 113
If J = φ Then                                  // Step 115
   For j = 0, 1, set g^+_j := g_j              // Step 117
   Exit and process next error pattern
Let j* ∈ J be such that LM(g_{j*}) = min_{j∈J}{LM(g_j)}   // Step 119
For j ∈ J                                      // Step 121
   If ≠ j* Then
```

$$\text{Set } g_j^+ := g_j - \frac{\Delta_j}{\Delta_{j*}} g_{j*}$$

```
   Else // j = j*
      Set g^+_j := (X - α_r^{-1})g_{j*}
```

Regarding the $j \neq j*$ part of step 121, note that multiplication by a non-zero constant is possible in other embodiments. For example, an update of the form $g_j^+ = \Delta_{j*} g_j - \Delta_j g_{j*}$ is also allowed.

It should be noted that multiplying all elements of a Groebner basis by (possibly different) non-zero constants results in a Groebner basis. Hence, multiplying the outputs of Algorithm A by non-zero constants again gives a Groebner basis with the required properties. Moreover, in Algorithm A, if each update of the form $$g_j^+ := g_j - \frac{\Delta_j}{\Delta_{j*}} g_{j*}$$

or $g^+_{j*} := (X - \alpha_r^{-1}) g_{j*}$ is replaced by $$g_j^+ := c \left( g_j - \frac{\Delta_j}{\Delta_{j*}} g_{j*} \right)$$

or $g^+_{j*} := c'(X - \alpha_r^{-1})g_{j*}$, respectively, where c, c' are non-zero constants that may depend on j, then the output will still be a Groebner basis with the required properties.

A stopping criterion for a Koetter algorithm according to an embodiment for fast Chase decoding, implemented as steps 101, 109, and 111, is as follows. Suppose that $(\alpha_1, \beta_1), \ldots, (\alpha_r, \beta_r)$ are correct pairs of error locations and corresponding error values, and that, as above, $r = \varepsilon - t$, so that an error-locator polynomial is, up to non-zero multiplicative constant, the second coordinate of the output $g_1^+$ of the derivative step of Koetter's iteration for adjoining error-locator $\alpha_r$. However, it is expensive to perform a Chien search. However, suppose there exists one more erroneous location, $\alpha_{r+1}$, within the weak coordinates, with corresponding error value is $\beta_{r+1}$. Then, according to embodiments of the disclosure, in Koetter's iteration for adjoining the pair $(\alpha_{r+1}, \beta_{r+1})$ to $(\alpha_1, \beta_1), \ldots, (\alpha_r, \beta_r)$. $\Delta_1 = 0$ for both the root step and the derivative step. For the root step, this follows from the fact that $\alpha_{r+1}^{-1}$ is a root of the ELP $\sigma(X)$, and for the derivative step it follows from the fact that $\omega(X)$, $\sigma(X)$ satisfy Forney's formula. Thus, checking if $\Delta_1 = 0$ for both the root step and the derivative step can serve as a stopping criterion. However, it is possible that $\Delta_1 = 0$ for both the root step and the derivative step even if there is not a correct error-locator polynomial, i.e., a false positive. The cost of handling a false positive is an increased complexity. However, even if the false positive rate is of the order 1/100, or even 1/10, the overall increase in complexity is negligible, and a Monte Carlo simulation can be used to obtain a reliable estimation in such situations. The cost of a stopping criterion according to an embodiment involves performing one more root step and half a derivative step for the discrepancy calculations for a sphere of radius $r + 1$ when $\varepsilon - t$ is only r. This reduces the overall complexity gain over a brute force Chien search. When $\varepsilon - t = r$, $r + 1$ errors are needed in the weak coordinates, which slightly degrades the FER in comparison to a brute force Chien search. It is to be understood that the implementation of a stopping criteria according to an embodiment in steps 101, 109, and 111 is exemplary and non-limiting, and other embodiments of the disclosure can use different implementations to achieve a same result.

Next, according to an embodiment, consider some simplifications. The above scheme has two pairs of polynomials to be maintained, rather than just two polynomials. In the above form, the algorithm will work even if $\varepsilon \geq 2t$, where $\varepsilon$ is the total number of errors. It should be noted that Wu's fast Chase algorithm does not have a version that supports more than $2t - 1$ errors. However, if $\varepsilon \leq 2t - 1$, as supported by Wu's algorithm, there is no need to maintain the first coordinate of the Groebner basis. For this, two questions should be answered:

1. How can $g_{j0}(\alpha_r^{-1})$ be calculated efficiently when only $g_{j1}$ is available?
2. How can $LM(g_0)$ be found without maintaining $g_{00}$ (recall that the leading monomial of $g_0$ is on the left)?

To answer the second question: introduce a variable $d_0$ to track the degree of $g_{00}$. Whenever $j^* = 0$, increase $d_0$ by 1, and in all other cases keep $d_0$ unchanged. Note that when $0 \in J$ but $0 \neq j^*$, $LM(g^+_0) = LM(g_0)$, as shown in Appendix A, which justifies keeping $d_0$ unchanged.

Recalling that the algorithm of FIG. 1 is invoked for any adjoined weak coordinate down the path front the root to a leaf, with the previous $g_1^+$ becoming the next $g_1$, an implementation according to an embodiment of this answer would involve initializing $d_0 = \deg(g_{00})$ in the root of the tree, before any invocation of the algorithm of FIG. 1. In the process of executing the tree traversal, the $d_0$ should be saved on vertices with more than one child and used as an initialization for all paths going down from that vertex to a leaf. A step of defining: $LM(g_0) = (X^{d_0}, 0)$ would be performed after step 105, and an update step, if $j^* = 0$ then $++d_0$, would be performed after step 119. Note that, in going down a path to a leaf, $d_0$ from a previous application of the algorithm of FIG. 1 should be used as an initial value for the next application of the algorithm.

Turning to the first question, it is known that for all r and all $(u, v) \in M_r(S^{(y)}, \alpha_1, \ldots, \alpha_r, \beta_1, \ldots, \beta_r)$, then $u \equiv S^{(y)} v \mod (X^{2t})$, and hence one can calculate $u(\alpha_r^{-1})$ directly from v if $\deg(u) \leq 2t - 1$ (see ahead). So, a first task is to verify that if $\varepsilon \leq 2t - 1$, so that $r \leq 2t - 1 - t = t - 1$, then $\deg(g_{10}) \leq 2t - 1$ and $\deg(g_{20}) \leq 2t - 1$ for all Koetter's iterations involved in fast Chase decoding, assuming the hypotheses of Theorem 3.1 hold.

First, however, recall the following proposition, which is just a re-phrasing of Prop. 2 of Beelen, et al., "On Rational Interpolation-Based List-Decoding And List-Decoding Binary Goppa Codes", IEEE Trans. Inform. Theory, Vol. 59, No. 6, pp. 3269-3281, June 2013 the contents of which are herein incorporated by reference in their entirety. For the sake of completeness, a proof is included in Appendix B. From this point on, a monomial in $K[X]^2$ will be said to be on the left if it contains the unit vector $(1, 0)$, and on the right if it contains the unit vector $(0, 1)$.

Proposition 4.1: Let $\{h_0 = (h_{00}, h_{01}), h_1 = (h_{10}, h_{11})\}$ be a Groebner basis for $M_0$ with respect to the monomial ordering $<$, and suppose that the leading monomial of $h_0$ is on the left, while the leading monomial of $h_1$ is on the right. Then $\deg(h_{00}(X)) + \deg(h_{11}(X)) = 2t$.

With Proposition 4.1, it can be proven that for all iterations of Koetter's algorithm, $\deg(g_{10}) \leq 2t - 1$ and $\deg(g_{20}) \leq 2t - 1$ when $\varepsilon \leq 2t - 1$. Before the proof, it will be useful to introduce some additional notation.

Definition 4.2: For $i = 1, \ldots, r$, $j \in \{0, 1\}$, and $T \in \{\text{root}, \text{der}\}$ write $g_j(i; T) = (g_{j0}(i; T), g_{j1}(i; T))$ and $g^+_j(i; T) = (g^+_{j0}(i; T), g^+_{j1}(i: T))$ for the values in the root step (T=root) or the derivative step (T=der) of Algorithm A corresponding to adjoining error location $\alpha_i$. Explicitly, the notation $g_0(i; \text{root})$ and $g_1(i; \text{root})$ are the values of the input variables $g_0$ and $g_1$ respectively, during the root iteration of the application of algorithm A for adjoining $\alpha_i$. Similarly, $g_0(i; \text{der})$ and $g_1(i; \text{der})$ are the values of the input variables $g_0$ and $g_1$, respectively, during the derivative iteration of the application of algorithm A for adjoining $\alpha_i$. By convention, $\{g_0(1; \text{root}), g_1(1; \text{root})\}$ is a Groebner basis for $M_0$ with $LM(g_0(1; \text{root}))$ on the left and $LM(g_1(1; \text{root}))$ on the right.

Proposition 4.3: Suppose that the condition in part 2 of Theorem 3.1 holds. Then for all $i \in \{1, \ldots, r\}$, all $j \in \{0, 1\}$ and all $T \in \{\text{root}, \text{der}\}$, $\deg(g_{j0}(i; T)) \leq \varepsilon$ and $\deg(g_{j1}(i; T)) \leq \varepsilon$, where $\varepsilon = t + r$ is the total number of errors.

Proof. By Theorem 3.1, $(\omega, \sigma) = c \cdot g^+_j(r; \text{der})$ for some $j \in \{0, 1\}$ and some $c \in F^*_q$, and hence necessarily $(\omega, \sigma) = c \cdot g^+_1(r; \text{der})$ for some $c \in F^*_q$, as the leading monomial of $(\omega, \sigma)$ is on the right. Note that for all i, j, and T, $LM(g^+_j(i; T)) \geq LM(g_j(i; T))$ is true, and so for all i and T, $LM(g_1(i; T)) \leq LM(\omega, \sigma) = (0, X^\varepsilon)$ must be true, in particular, $\deg(g_{10}(i; T)) \leq \varepsilon - 1$, and $\deg(g_{11}(i; T)) \leq \varepsilon$.

Turning to $g_0(i; T)$, note that for all i, j, and T, $LM(g^+_j(i; T)) > LM(g_j(i; T))$ for at most one $j \in \{0, 1\}$. Also, for $j \in \{0, 1\}$ and for each i and T with $LM(g^+_j(i; T)) > LM(g_j(i; T))$, $LM(g^+_j(i; T)) = X \cdot LM(g_j(i; T))$ is true. Since the degree of the second coordinate of $g_j(i; T)$, the coordinate containing the leading monomial, must increase from $\deg(g_{1j}(1; \text{root}))$ for $i = 1$ and T=root to $\deg(\sigma) = \varepsilon$ for $i = r$ and T=der, it follows that $|\{(i,T)|LM(g^+{}_1(i;T))>LM(g_1(i;T))\}|=\varepsilon-\deg(g_{11}(1;\text{root}))$, and therefore, $|\{(i,T)|LM(g_0^+(i;T))>LM(g_0(i;T))\}| \le 2r-(\varepsilon-\deg(g_{11}(1;\text{root})))=$ $\deg(g_{11}(1;\text{root}))+r-t$.

Hence, for all i and T, $\deg(g_{00}(i;T)) \le \deg(g_{00}(r;der))(LM(\text{on the left})\text{does not decrease})$ $\le \deg(g_{00}(1;\text{root}))+\deg(g_{11}(1;\text{root}))+r-t$ $= t+r = \varepsilon$ (by Proposition 4.1).

Finally, since the leading monomial of $g_0(i; T)$ is on the left, it follows that $\deg(g_{01}(i; T))-1<\deg(g_{00}(i; T))\le\varepsilon$, which proves $\deg(g_{01}(i; T))\le\varepsilon$.

Using Proposition 4.3, $g_{j0}(\alpha_r^{-1})$ can be calculated in Algorithm A while maintaining only the right polynomials $g_{j1}(j\in\{0,1\})$. According to embodiments of the disclosure, an efficient O(t) method for calculating $g_{j0}(\alpha_r^{-1})$ is as follows.

For a polynomial $v(X)\in K[X]$, assume that $\delta:=\deg(v)\le\varepsilon\le 2t-1$, and write $v(X)=v_0+v_1X+\ldots+v_{2t-1}X^{2t-1}$. For short, write $S(X)=S_0+S_1X+\ldots+S_{2t-1}X^{2t-1}:=S^{(y)}(X)$. Then for $\beta\in F_q$, $(Sv \bmod(X^{2t}))(\beta)$ can be expressed as $S_0v_0+(S_0v_1+S_1v_0)\beta+(S_0v_2+S_1v_1+S_2v_0)\beta^2+\ldots$
$(S_0v_{2t-1}+S_1v_{2t-2}+S_2v_{2t-3}+\ldots+S_{2t-1}v_0)\beta^{2t-1}$, (5)

For $j\in\{0,\ldots,2t-1\}$, let $A_j(v,\beta)$ be the sum over the j-th column of EQ. (5). Then $A_j(v,\beta)=S_j\beta^j(v_0+v_1\beta+\ldots+v_{2t-1-j}\beta^{2t-1-j})$, If $2t-1-j\ge\delta(=\deg(v))$, then $A_j(v,\beta)=S_j\beta^j v(\beta)$. Hence if $\beta$ is a root of $v(X)$, then $(Sv\bmod(X^{2t}))(\beta)=\Sigma_{j=0}^{2t-1}A_j(v,\beta)=\Sigma_{j=2t-\delta}^{2t-1}A_j(v,\beta)$ (6)

The sum on the right-hand side of EQ. (6) may be calculated recursively. For this, let $\tilde{A}_j(v,\beta):=\beta^j\Sigma_{i=0}^{2t-1-j}v_i\beta^i$, so that $A_j(v,\beta)=S_j\tilde{A}_j(v,\beta)$. Then $\tilde{A}_{2t-\delta-1}=0$, and for all $j\in\{2t-\delta-1,\ldots,2t-2\}$, $$\frac{\tilde{A}_{j+1}(v,\beta)}{\beta^{2t}} = \beta\cdot\frac{\tilde{A}_j(v,\beta)}{\beta^{2t}} - v_{2t-1-j}. \quad (7)$$

Calculating, $\beta^{2t}$ takes $O(\log_2(2t))$ squarings and multiplications. In fact, this can be calculated once, before starting the depth-first search in Wu's tree, for all non-reliable coordinates, not just for those corresponding to a particular leaf. After that, each one of the iterations of EQ. (7) in the calculation of the sum of EQ. (6 requires 2 finite-field multiplications: two for moving from $\tilde{A}_j(v,\beta)/\beta^{2t}$ to $\tilde{A}_{j+1}(v,\beta)/\beta^{2t}$, and one for multiplying by $S_{j+1}$ before adding to an accumulated sum. Then, after the calculation of the accumulated sum, one additional multiplication by $\beta^{2t}$ is required.

Figure 4:
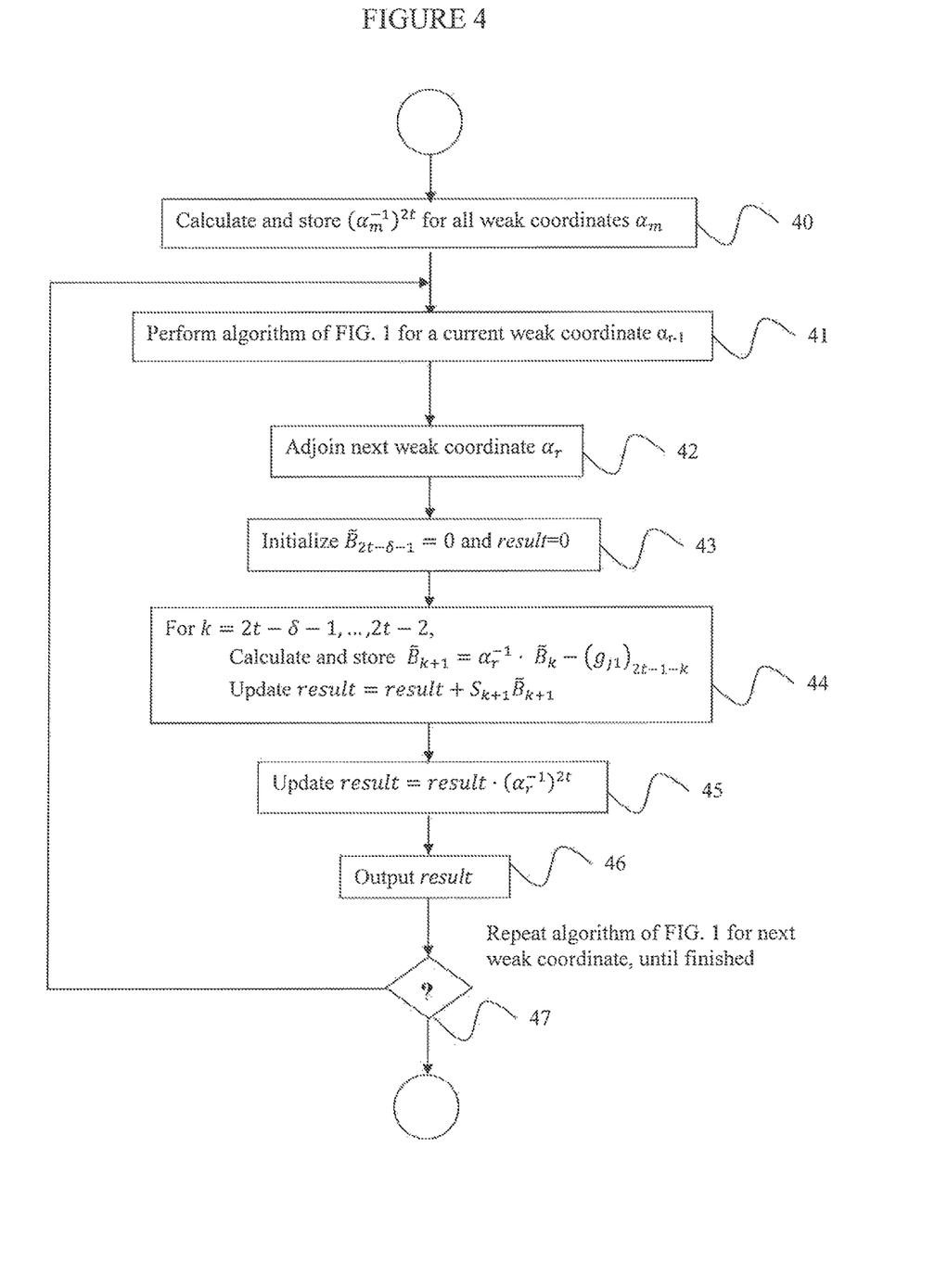
FIG. 4 is a flow chart of an algorithm for efficiently calculating $g_{j0}(\alpha_r^{-1})$ when only $g_{j1}$ is available, according to an embodiment of the disclosure.

FIG. 4 is a flow chart of an algorithm for an answer to the first question, according to an embodiment of the disclosure. An algorithm according to an embodiment, with references to the steps of FIG. 4, is as follows.

Before starting an algorithm of FIG. 1:

| | |
|---|---|
| Calculate and store $(\alpha_m^{-1})^{2t}$ for all weak coordinates $\alpha_m$ | // Step 40 |
| Perform algorithm of FIG. 1 for weak coordinate $\alpha_{r-1}$ | //Step 41 |
| When adjoining a next weak coordinate $\alpha r$, for any choice of the corresponding error value $\beta_r$, if type == der, perform the following steps: | //Step 42 |
| Initialize $\tilde{B}_{2t-\delta-1} = 0$ // $\tilde{B}_j \equiv \dfrac{\tilde{A}_{j+1}(v,\beta)}{\beta^{2t}}$, where $v = g_{j1}$ and $\beta = \alpha_r^{-1}$; | Step 43 |
| Initialize result=0<br>For k = 2t − δ − 1, . . . , 2t − 2,<br>  Calculate and store $\tilde{B}_{k+1} = \alpha_r^{-1} \cdot \tilde{B}_k - (g_{j1})_{2t-1-k}$<br>  // $(g_{j1})_m$ is the coefficient of $X^m$ in $g_{j1}$<br>  Update result = result + $S_{k+1}\tilde{B}_{k+1}$<br>  //$S_{k+1}$ is a syndrome polynomial coefficient<br>Update result = result $\cdot (\alpha_r^{-1})^{2t}$ | //Step 44 |
| // $(\alpha_r^{-1})^{2t}$ was pre-calculated once in the first step; | Step 45 |
| Output result // result is $g_{j0}(\alpha_r^{-1})$ for j == 0, 1; | Step 46 |
| Return to step 41 and repeat algorithm of FIG. 1 for next weak coordinate, until all weak coordinates have been processed. | // Step 47 |

5. Fast Chase Decoding

Figure 2:
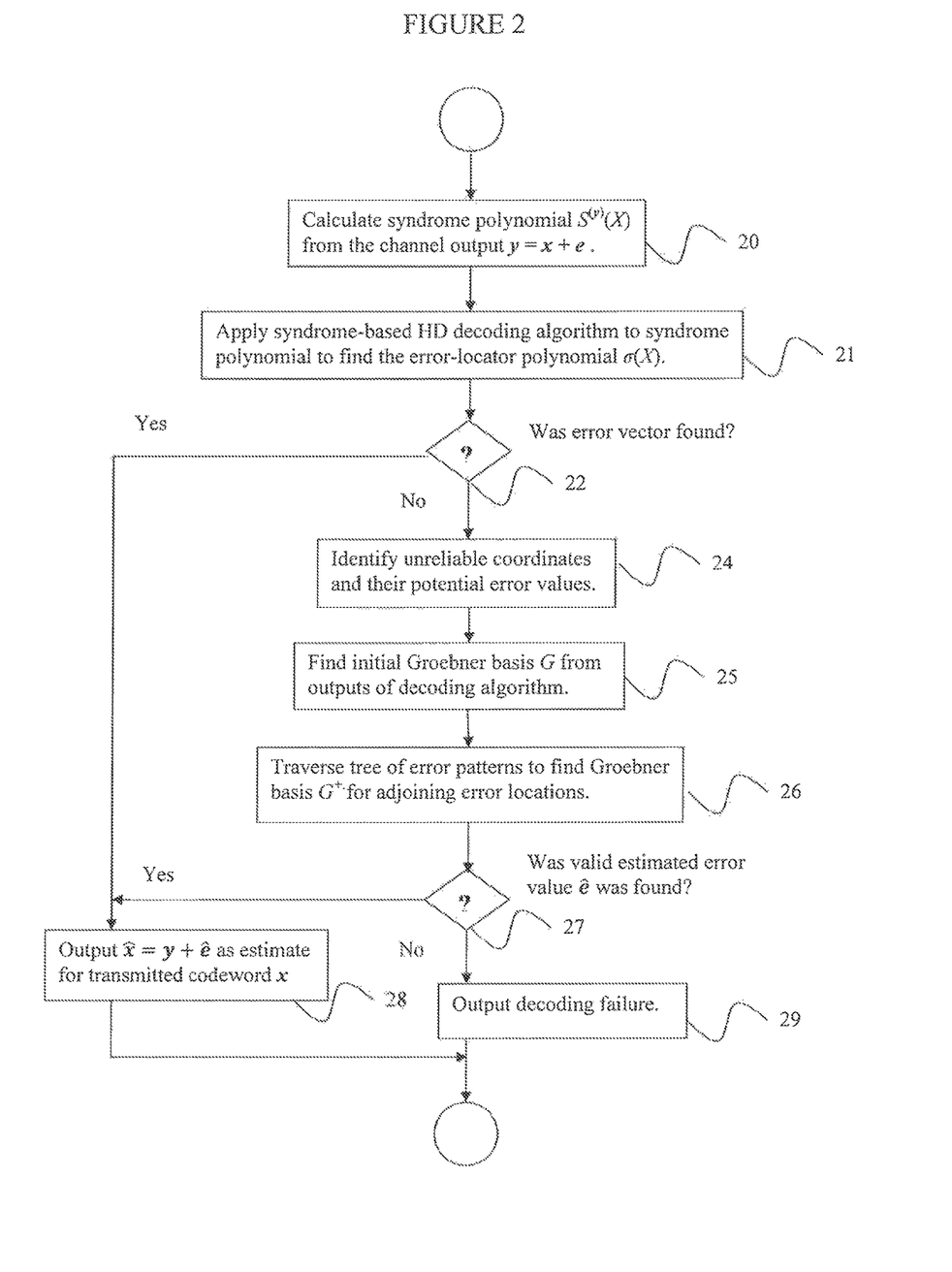
FIG. 2 is a flowchart of an algorithm for fast chase decoding of generalized Reed-Solomon codes according to embodiments of the disclosure.

FIG. 2 is a flowchart of an algorithm for fast chase decoding of generalized Reed-Solomon codes according to embodiments of the disclosure. As above, consider a primitive generalized Reed-Solomon (GRS) code, $C\subseteq F_q^n$, of length $n:=q-1$, q be a prime power, and designed distance $d\in N^*$, $d\ge 2$, and $F_q$ be the finite field of q elements Given a received codeword y=x+e, where $X\in C$ is a transmitted GRS codeword, C is a GRS code, and e is an error vector, a decoding algorithm begins at step 20 by calculating the syndrome polynomial $S^{(y)}(X)$ from the Channel output y, wherein $S^{(y)}(X):=S_0+S_1X+\ldots+S_{d-2}X^{d-2}$ and $S_j=S_j^{(y)}:=(\tilde{a}\odot y)(\alpha^j)$, and applying a syndrome-based hard decision algorithm at step 21 to the input $S^{(y)}(X)$ to find the estimated error-locator polynomial (ELP) $\sigma(X):=\Pi_{i=1}^\varepsilon(1-\alpha_iX)$. Exemplary syndrome-based hard decision algorithms include, but are not limited to, the Berlekamp-Massey (BM), Fitzpatrick's algorithm and the Euclidean algorithm.

Next, at step 22, check whether the syndrome-based hard decision algorithm succeeded in finding an error vector of weight up to t, where t is the error-correction radius of the GRS code, i.e., $$t = \left\lceil \frac{d-1}{2} \right\rceil.$$

If the syndrome-based hard decision algorithm is the BM algorithm, then one way of doing this is to let the output of the BM algorithm be a pair $(\hat{\sigma}, L)$, where $\hat{\sigma}=\hat{\sigma}(X)$ is the estimated ELP, while L is the LFSR length calculated in the BM algorithm. The decoding is a success if the following condition holds: $\deg(\hat{\sigma}(X))=L$ and $\hat{\sigma}(X)$ has L distinct roots in $F_q$.

If, at step 28, the HD decoding is successful, let the estimated error locations be the inverses of the roots of the estimated ELP $\hat{\sigma}(X)$, calculate the error values, and estimate ê for the error vector from the estimated error locations and error values, and output the estimate $\hat{x}:=y+\hat{e}$ for x.

According to embodiments, error values can be calculated by finding the error evaluator polynomial (EEP) $\omega(X) \in F_q[X]$, by $\omega(X) := \Sigma_{i=1}^{\varepsilon} \alpha_i \beta_i \Pi_{j \neq i}(1-\alpha_j X)$, by substituting $\hat{\sigma}(X)$ as the ELP in the key equation $\omega \equiv S^{(y)} \sigma \mod (X^{d-1})$. According to other embodiments, error values can be calculated using Forney's formula.

Otherwise, if the HD decoding is unsuccessful, the unreliable ("weak") coordinates and their potential error values are identified at step 24, and an initial Groebner basis G based on the outputs of the syndrome-based hard decision algorithm is found at step 25.

According to embodiment, if the syndrome based hard decision algorithm is the BM algorithm, finding an initial Groebner basis G based on the BM algorithm outputs includes defining $b_1 := (S\sigma \mod X^{d-1}, \sigma)$, and $b_2 := (SX^m B \mod X^{d-1}, X^m B)$, where B is a polynomial output from the BM algorithm that is a copy of the last ELP before L was updated, and outputting one of (1) $c\{b_1, b_2\}$ as the Groebner basis if the leading monomials of $b_1$ and $b_2$ contain distinct unit vectors, where c is a non-zero constant; (2) $d\{b_1-cX^l b_2, b_2\}$ as the Groebner basis if the leading monomials contain the same unit vector and the leading monomial of $b_1$ is at least as large as that of $b_2$, where $c \in K^*$ and $l \in N$ are chosen such that the leading monomial of $b_1$ is canceled, and d is a non-zero constant; or (3) $\{db_1, d(b_2-cX^l b_1)\}$ as the Groebner basis if the leading monomials contain the same unit vector and the leading monomial of $b_2$ is strictly larger than that of $b_1$, where $c \in K^*$ and $l \in N^*$ are chosen such that the leading monomial of $b_2$ is canceled, and d is a non-zero constant.

Next, a subset of all possible error patterns $$E_{i_1} \times \ldots \times E_{i_{n_0}},$$

on the unreliable coordinates is scanned, where $n_0$ is the number of unreliable coordinates, and $i_1, \ldots, i_{n_0}$ are the unreliable coordinates. The subset of error patterns is formed into a tree, where vertices correspond to error patterns and edges connect a "parent" error pattern to a "child" error pattern having exactly one additional non-zero value.

At step 26, traverse the tree of error patterns until $\Delta_1=0$ for both the root and der steps, wherein moving from a vertex corresponding to an error pattern with error locations $\alpha_1, \ldots, \alpha_{r-1}$ and corresponding error values $\beta_1, \ldots, \beta_{r-1}$ to a child with one additional error location $\alpha_r$ and corresponding error value $\beta_r$ corresponds to moving from a current Groebner basis $G=\{g_0=(g_{00}, g_{01}), g_1=(g_{10}, g_{11})\}$ for $M_{r-1}(S^{(y)}, \alpha_j, \ldots, \alpha_{r-1}, \beta_1, \ldots, \beta_{r-1})$, with $LM(g_j)$ containing the j-th unit vector for $j \in \{0, 1\}$ to a Groebner basis $G^+ = \{g^+_0=(g^+_{00}, g^+_{01}), g^+_1=(g^+_{10}, g^+_{11})\}$ for $M_r(S^{(y)}, \alpha_1, \ldots, \alpha_r, \beta_1, \ldots, \beta_r)$ with $LM(g^+_j)$ containing the j-th unit vector for $j \in \{0, 1\}$. According to embodiments, Koetter's iteration Algorithm A for adjoining error locations $\alpha_r$ can be used to move from the Groebner basis G to the Groebner basis $G^+$.

The correct error pattern is reached if there is a total t+r of erroneous coordinates in y, and if $\alpha_1, \ldots, \alpha_r$ are indeed error locations and $\beta_1, \ldots, \beta_r$ are indeed the corresponding error values, and it is guaranteed that the output $g_1^+$ of the algorithm satisfies $g_1^+ = c \cdot (\omega, \sigma)$ for some non-zero constant c, where $\omega$ is the EEP and $\sigma$ is the ELP. To use a simplified stopping criterion according to an embodiment, the maximum tree depth should be increased by 1, and a Chien search is performed only in case $\Delta_1=0$ for both the root and the derivative iterations. If there is one additional error locator $\alpha_{r+1}$ in the weak coordinates and the set of potential error patterns for coordinate $\alpha_{r+1}$ includes the correct error value $\beta_{r+1}$ for $\alpha_{r+1}$, then the stopping criterion will succeed.

If, at step 27, a valid estimated error value ê was found, $\hat{x}=y+\hat{e}$ is output at step 28 as an estimate for the transmitted codeword x. Otherwise, at step 29. If no such ê is found, a decoding failure is output.

According to embodiments, the complexity of an algorithm according to an embodiment can be roughly compared with one iteration of Wu's Algorithm 1, pp. 114-115 of Y. Wu, "Fast Chase Decoding Algorithms and Architectures for Reed-Solomon Codes", IEEE Trans. Inform. Theory, Vol. 58, No. 1, pp. 109-129, January 2012, incorporated by reference above.

In Wu's iteration, there are 2 substitutions in polynomials of degrees typically growing from t to ε, and two calculations of substitutions of the form (Sf mod $X^{2t}$)(x) based on the knowledge of f, using Wu's, EQS. (23) and (24). Each of the last two substitutions takes about 2t multiplications, noting that the internal sums of Wu's, EQS. (23) and (24) were already calculated for the first two substitutions.

In an algorithm according to an embodiment, there are 2 substitutions in polynomials of degrees typically growing from t to ε, two calculations of substitutions of the form (Sf mod $X^{2t}$)(x) based on the knowledge of f using the recursion EQ. (7), each requiring about 2t multiplications, and two substitutions in the derivative $g'_{j1}$, which, in characteristic 2 has non-zero coefficients only for even powers of X.

In a typical application of Wu's algorithm, there are 3 multiplications of a vector by a scalar, where the vector length typically grows from t to ε. On the other hand, in an algorithm according to an embodiment, there are 4 such multiplications, 2 for each one of the root and der steps. However, this advantage of Wu's algorithm is balanced by the following item.

Wu's method requires a syndrome update step that updates about t syndrome coordinates with a total of about t multiplications, which is completely avoided in an algorithm according to an embodiment.

Considering the above, the complexity of an algorithm according to an embodiment is somewhat higher than that of Wu's iteration. However, it is conceptually simpler. Also, an algorithm according to an embodiment is suitable for working in the so-called transform domain, using evaluation vectors of both the and the formal derivatives of the $g_{j1}$. Moreover, an algorithm according to an embodiment can work also for the case where the total number of errors is strictly above d−1, by maintaining two pairs of polynomials.

6. System Implementations

It is to be understood that embodiments of the present disclosure can be implemented in various forms of hardware, software, firmware, special purpose processes, or a combination thereof. In one embodiment, the present disclosure can be implemented in hardware as an application-specific integrated circuit (ASIC), or as a field programmable gate array (FPGA). In another embodiment, the present disclosure can be implemented in software as an application program tangible embodied on a computer readable program storage device. The application program can be uploaded to, and executed by, a machine comprising any suitable architecture.

Figure 3:
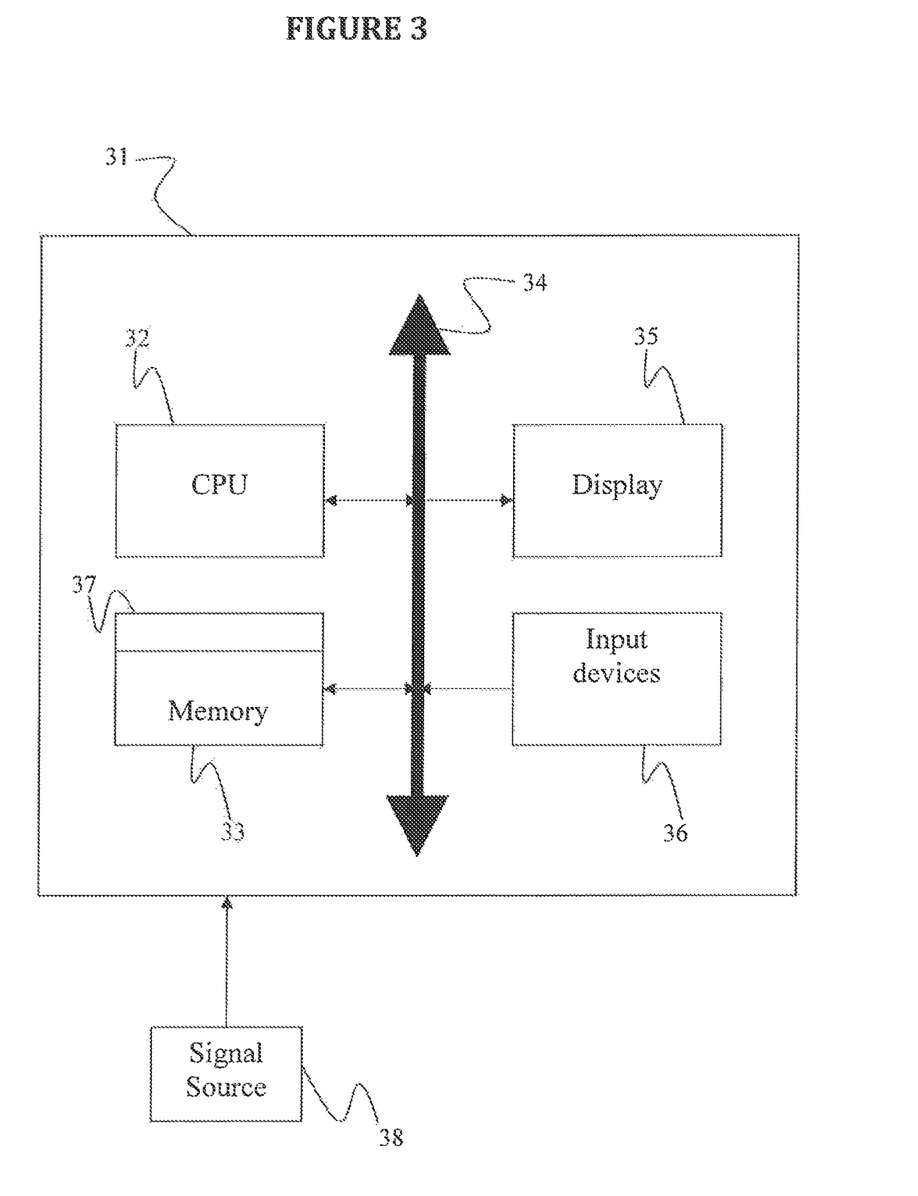
FIG. 3 is a block diagram of a system for fast chase decoding of generalized Reed-Solomon codes, according to an embodiment of the disclosure.

FIG. 3 is a block diagram of a system for fast chase decoding of generalized Reed-Solomon codes, according to an embodiment of the disclosure. Referring now to FIG. 3, a computer system 31 for implementing the present invention can comprise, inter alia, a central processing unit (CPU) 32, a memory 33 and an input/output (I/O) interface 34. The computer system 31 is generally coupled through the I/O interface 34 to a display 35 and various input devices 36 such as a mouse and a keyboard. The support circuits can include circuits such as cache, power supplies, clock circuits, and a communication bus. The memory 33 can include random access memory (RAM), read only memory (ROM), disk drive, tape drive, etc., or a combinations thereof. The present disclosure can be implemented as a routine 37 that is stored in memory 33 and executed by the CPU 32 to process the signal from the signal source 38. As such, the computer system 31 is a general purpose computer system that becomes a specific purpose computer system when executing the routine 37 of the present invention. Alternatively, as described above, embodiments of the present disclosure can be implemented as an ASIC or FPGA 37 that is in signal communication with the CPU 32 to process the signal from the signal source 38.

The computer system 31 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to exemplary embodiments, those skilled in the art will appreciate that various modifications and substitutions can be made thereto without departing from the spirit and scope of the invention as set forth in the appended claims.

A. Koetter's Algorithm

For completeness, a self-contained presentation of Koetter's algorithm is presented hereinbelow, taken from Sect. VII.C of R. J. McEliece, "The Guruswami-Sudan Decoding Algorithm for Reed-Solomon Codes", IPN Progress Report, Vol. 42-453, May 2003, the contents of which are herein incorporated by reference in their entirety. For convenience, the current presentation of the algorithm is stated in the language of Groebner bases.

Let K be a field. Fork $l \in \mathbb{N}^*$ and for a $K[X]$-submodule M of $K[X]^{l+1}$ with rank(M)=l+1, suppose that there is a Groebner basis $G=\{g_0, \ldots, g_l\}$ for M with respect to some monomial ordering $<$ on $K[X]^{l+1}$. In such a case, the leading monomials of the $g_j$ must contain distinct unit vectors, as otherwise, the leading monomial of two basis vectors would contain the same unit vector, so that the leading monomial of one vector divides the leading monomial of the other vector. In such a case, one of the basis vectors may be discarded which leaves a Groebner basis, which is, in particular, a set of less than l+1 generators for a free module of rank l+1, which is a contradiction. Thus, according to an embodiment, it may be assumed without loss of generality that the leading monomial of $g_j$ contains the j-th unit vector, for all $j \in \{0, \ldots, l\}$, where coordinates of vectors are indexed by $0, \ldots, l$.

From this point on, according to an embodiment, $<$ will stand for an arbitrary monomial ordering on $K[X]^{l+1}$.

Now let D: $K[X]^{l+1} \rightarrow K$ be a non-zero linear functional that satisfies the following property:

MOD $M^+:=M \cap ker(D)$ is a $K[X]$-module,

Before proceeding, it may be useful to note that, as a consequence of the proof of validity of Koetter's algorithm appearing ahead, it holds that moving from M to $M^+$ does not decrease the rank. The purpose of Koetter's algorithm is to convert the (l+1)-element Groebner basis G of M to an (l+1)-element Groebner basis $G^+=\{g^+_0, \ldots, g^+_l\}$ of $M^+$, while maintaining the property that $LM(g^+_j)$ contains the f-th unit vector for all $j \in \{0, \ldots, l\}$. From this point on, "Groebner basis" will mean a Groebner basis with respect to a fixed monomial ordering $<$.

Now, it can be proved that a single iteration of Koetter's algorithm has the required properties.

Koetter's Iteration without Inversions:

Input: A Groebner basis $G=\{g_0, \ldots, g_l\}$ for the submodule $M \subseteq F_q^{l+1}$, with $LM(g_j)$ containing the j-th unit vector for all j.

Output: A Groebner basis $G^+=\{g^+_0, \ldots, g^+_l\}$ for $M^+$ with $LM(g^+_j)$ containing the j-th unit vector for all j, assuming MOD holds.

Algorithm:

---

For j = 0, ..., l, calculate $\Delta_j := D(g_j)$
Set J := $\{j \in \{0, ..., l\} | \Delta_j \neq 0\}$
If J = ∅, Then
    For j = 0, ..., l, set $g^+_j := g_j$
    Exit
Let $j^* \in J$ be such that $LM(g_{j^*}) = \min_{j \in J}\{LM(g_j)\}$
    /* the leading monomials are distinct, and so j* is unique */
For j ∈ J
    If j ≠ j*
        Set $g^+_j := \Delta_{j^*}g_j - \Delta_j g_{j^*}$
    Else /* j = j** */
        Set $g^+_{j^*} := \Delta_{j^*} X g_{j^*} - D(X g_{j^*}) g_{j^*}$
        /* = $(\Delta_{j^*} X - D(X g_{j^*})) g_{j^*}$ */

---

Proposition A.2: At the end of Koetter's iteration, it holds that $G^+=\{g^+_0, \ldots, g^+_l\}$ is a Groebner basis for $M^+$ and for all j, $LM(g^+_j)$ contains the j-th unit vector.

Proof: First note that by the linearity of D, at the end of Koetter's iteration, $g^+_j \in M^+$ for all j. It will be proven that for all j, $LM(g^+_j) = \min \{LM(f) | f \in M^+$ and $LM(f)$ contains the j-th unit vector$\}$.

This show that, since modules according to embodiments are over $K[X]$, the leading monomial of every element in $M^+$ is divisible by the leading monomial of some element from $G^+$, and hence $G^+$ is a Groebner basis.

For $j \in \{0, \ldots, 1\}$, write
$M_j := \{f \in M \setminus \{0\} | LM(f)$ contains the j-th unit vector$\}$
and
$M^+_j := \{f \in M^+ \setminus \{0\} | LM(f)$ contains the j-th unit vector$\}$.
Note that since $M^+ \subseteq M$, it also holds that $M^+_j \subseteq M_j$ for all j.

Take some $j \in \{0, \ldots, 1\}$. If $j \in J$, then since $g^+_j = g_j$ and $LM(g_j)$ is minimal in $LM(M_j) \subseteq LM(M^+_j)$, then certainly $LM(g^+_j)$ is minimal in $LM(M^+_j)$. This minimality follows from the assumptions on G. Similarly, if $j \in J$ and $j \neq j^*$, then $$LM(g^+_j) = LM(\Delta_{j^*} g_j - \Delta_j g_{j^*}) = LM(g_j),$$

and again, $LM(g^+_j)$ is minimal in $LM(M^+_j)$.

It remains to verify that if $J \neq \emptyset$, then $LM(g^+_{j^*}) = \min(LM(M^+_{j^*}))$. Note first that because < is a monomial ordering, $LM(Xg_{j^*}) = X \ LM(g_{j^*})$, and $X \ LM(g_{j^*}) > LM(g_{j^*})$. Hence, $LM(g^+_{j^*}) = X \ LM(g_{j^*})$. In addition, $X \ LM(g_{j^*})$ is the immediate successor of $LM(g_{j^*})$ in $LM(M_{j^*})$.

Suppose that there exists some $h_{j^*} \in M^+_{j^*}$ with $LM(h_{j^*}) < LM(g^+_{j^*})$. It will be proven that this implies an infinite decreasing chain, and hence a contradiction. Because $h_{j^*}$ is also in $M_{j^*}$, then $LM(h_{j^*}) \geq LM(g_{j^*})$ must be true, and therefore $LM(g_{j^*}) \leq LM(h_{j^*}) < LM(g^+_{j^*})$. But $LM(g^+_{j^*})$ is the immediate successor of $LM(g_{j^*})$ in $LM(M_{j^*})$, and therefore $LM(h_{j^*}) = LM(g_{j^*})$ must be true.

Let $c \in K^*$ be such that $LM(g_{j^*} - ch_{j^*})$ is strictly smaller than $LM(h_{j^*}) = LM(g_{j^*})$ and set $\delta_0 := g_{j^*} - ch_{j^*}$. Note that since $g_{j^*} \notin M^+$ while $h_{j^*} \in M^+$, then $\delta_0 \notin M^+$, and, in particular, $\delta_0 \neq 0$. Suppose that $LM(\delta_0)$ contains the $j_0$-th unit vector for some $j_0 \in \{0, \ldots, 1\}$.

If $j_0 \in J$, then $LM(\delta_0) < LM(g_{j^*}) \leq LM(g_{j0})$, where the first inequality follows from the construction of $\delta_0$, and the second from the definition of $j^*$. Since $\delta_0 \in M_{j0}$, this contradicts the assumption on $g_{j0}$.

It follows that $j_0 \notin J$. By the minimality of $LM(g_{j0})$ in $LM(M_{j0})$, there exists some $d \geq 0$ such that $LM(\delta_0) = X^d LM(g_{j0})$. Choose $c \in K^*$ such that the leading monomial cancels in $\delta_1 := \delta_0 - cX^d g_{j0}$. Note that $\delta_1 \notin M^+$, because $\delta_0 \notin M^+$, while $g_{j0} \in M^+$ since $j_0 \notin J$. Then by construction, $\delta_1 \neq 0$, and $LM(\delta_1) < LM(\delta_0)$).

Suppose that $LM(\delta_1)$ contains the $j_1$-th unit vector. If $j_1 \in J$, then $LM(\delta_1) < LM(\delta_0) < LM(g_{j^*}) \leq LM(g_{j1})$, a contradiction, since $\delta_1 \in M_{j1}$. Hence $j_1 \notin J$. Continuing this way, an infinite strictly decreasing chain can be obtained, which is a contradiction.

B. Proof of Proposition 4.1

Since $(S^{(y)}, 1)$ is in the $F_q[X]$-span of $\{h_0, h_1\}$, it follows that $I \in (h_{01}, h_{11})$, and hence that $h_{01}$ and $h_{11}$ are relatively prime. Now suppose that $\alpha(X), \beta(X) \in F_q[X]$ are such that $\alpha(X) h_0 - \beta(X) h_j = (?, 0)$. Then $\alpha(X) h_{01}(X) = \beta(X) h_{11}(X)$, and because $\gcd(h_{01}, h_{11}) = 1$, this implies that $h_{11}(X) | \alpha(X)$, $h_{01}(X) | \beta(X)$, $$\frac{\alpha(X)}{h_{11}(X)} = \frac{\beta(X)}{h_{01}(X)},$$

and these two equal rational functions are in fact a polynomial in $F_q[X]$. Write $r(X) \in F_q[X]$ for this polynomial. Let $\pi_0: F_q[X]^2 \to F_q[X]$ be the projection to the first coordinate. Now, the second coordinate of the vector $$f := h_{11}(X) h_0 - h_{01}(X) h_1 \in M_0$$

is 0, and for $\alpha(X), \beta(X)$ as above, it follows from the above explanation that $$\alpha(X) h_0 - \beta(X) h_1 = r(X) f.$$

This shows that $\pi_0(f)$ has the lowest degree in $\pi_0 \ (M_0 \cap \{(?, 0)\})$. Now, as $M_0$ is generated as an $F_q[X]$-module by $\{(X^{2t}, 0), (S^{(y)}(X), 1)\}$, this lowest degree is 2t. Hence $\deg(\pi_0(f))$ 2t. Now, $$\deg(\pi_0(f)) = \deg(h_{11}(X) h_{00}(X) - h_{01}(X) h_{10}(X))$$
$$= \deg(h_{11}(X) h_{00}(X)),$$

because by assumption $\deg(h_{11}) \geq \deg(h_{10}) + 1$ and $\deg(h_{00}) > \deg(h_{01}) - 1$, so that $$\deg(h_{11} h_{00}) > \deg(h_{01} h_{10}).$$

This concludes the proof.

What is claimed is:

1. An application specific integrated circuit (ASIC) tangibly encoding a program of instructions executable by the integrated circuit to perform a method for fast Chase decoding of generalized Reed-Solomon (GRS) codes, the method comprising the steps of:
   receiving, by the ASIC, a GRS codeword y=x+e from a communication channel, wherein where x is a transmitted GRS codeword, and e is an error vector;
   using outputs of a syndrome-based hard-decision (HD) algorithm to find an initial Groebner basis $G = \{g_0 = (g_{00}, g_{01}), g_1 = (g_{10}, g_{11})\}$ for a solution module of a key equation, upon failure of HD decoding of the GRS codeword;
   traversing a tree of error patterns in $$E_{i_1} \times \ldots \times E_{i_{n_0}}$$

on a plurality of unreliable coordinates to adjoin a next weak coordinate wherein $n_0$ is a number of the unreliable coordinates, $i_1, \ldots, i_{n_0}$ are the unreliable coordinates, vertices of the tree of error patterns correspond to error patterns, and edges connect a parent error pattern to a child error pattern having exactly one additional non-zero value, to find a Groebner basis $G^+$ for each adjoining error location; and
   outputting an estimated transmitted codeword $\hat{x} := y + \hat{e}$ when a correct error vector $\hat{e}$ has been found.

2. The ASIC of claim 1, wherein the syndrome-based HD algorithm is selected from a group that includes the Berlekamp-Massey (BM) algorithm and Fitzpatrick's algorithm.

3. The ASIC of claim 1, wherein finding an initial Groebner basis G comprises:
   defining polynomials $b_1 := (S\sigma \mod X^{d-1}, \sigma)$, and $b_2 := (SX^m B \mod X^{d-1}, X^m B)$, wherein S is the syndrome polynomial, $\sigma$ is the estimated ELP output by the BM algorithm, m is the number of iterations since the last linear feedback shift register (LFSR) length change in the BM algorithm, and B is a polynomial output from the BM algorithm that is a copy of the last estimated ELP $\sigma$ before the LFSR length L was updated; and
   outputting one of (1) c$\{b_1, b_2\}$ as the Groebner basis when leading monomials of $b_1$ and $b_2$ contain distinct unit vectors, for a non-zero constant c; (2) $\{d(b_1 - cX^i b_2), db_2,\}$ as the Groebner basis when the leading monomials contain a same unit vector and the leading monomial of $b_1$ is at least as large as that of $b_2$, wherein $c \in K^*$ and $l \in N$ are chosen such that the leading monomial of $b_2$ is canceled and d is a non-zero constant, or (3) $\{db_1, d(b_2-cX^lb_1)\}$ as the Groebner basis when the leading monomials contain the same unit vector and the leading monomial of $b_2$ is strictly larger than that of $b_1$, wherein $c \in K^*$ and $l \in N^*$ are chosen such that the leading monomial of $b_2$ is canceled and d is a non-zero constant.

4. The ASIC of claim 1, wherein traversing a tree of error patterns to find a Groebner basis $G^+$ for each adjoining error location comprises:

calculating a root discrepancy $\Delta_j^{rt} := g_{j1}(\alpha_r^{-1})$ for $j=0$ and 1, wherein $g_0=(g_{00}(X), g_{01}(X))$ and $g_1=(g_{10}(X), g_{11}(X))$ constitute a current Groebner basis and $\alpha_r$ is a next error location and r is a number of error locations;

setting, when a set $$J := \{j \in \{0, 1\} \mid \Delta_j^{rt} \neq 0\} \neq \emptyset, \; g_j^+ := c\left(g_j - \frac{\Delta_j^{rt}}{\Delta_{j*}^{rt}} g_{j*}\right)$$

when ($j \neq j^*$), wherein $j^* \in J$ is such that a leading monomial of $g_{j*}$ is a minimum leading monomial of $(g_j)$ for all $j \in J$ and c is a non-zero constant, or $g^+_j := c(X - \alpha_r^{-1})g_{j*}$, when $j=j^*$, wherein X is a free variable;

setting $g_j := g^+_j$ for $j=0$ and 1;

calculating a derivative discrepancy $\Delta_j^{der} := \beta_r \alpha_r g'_{j1} (\alpha_r^{-1}) + \alpha_r g_{j0}(\alpha_r^{-1})$ for $j=0$ and 1, wherein $\beta_r$ is a value of location $\alpha_r$, and $g'_{j1}(X)$ is a formal derivative of $g_{j1}(X)$;

setting, when a set $$J := \{j \in \{0, 1\} \mid \Delta_j^{der} \neq 0\} \neq \emptyset, \; g_j^+ := c\left(g_j - \frac{\Delta_j^{der}}{\Delta_{j*}^{der}} g_{j*}\right)$$

when ($j \neq j$), wherein $j^* \in J$ is such that a leading monomial of $M(g_{j*})$=a minimum leading monomial of $(g_j)$ for all $j \in J$ and c is a non-zero constant, or $g^+_j := c(X-a\alpha_r^{-1})g_{j*}$ when $j=j^*$.

5. The ASIC of claim 4, further comprising, when set $J:=\{j \in \{0, 1\} \mid \Delta_j^{re} \neq 0\} = \emptyset$ or when set $J:=\{j \in \{0, 1\} \mid \Delta_j^{der} \neq 0\} = \emptyset$, setting $g^+_j := g_j$ for $j=0, 1$, wherein $g^+_0 = (g^+_{00}, g^+_{01})$ and $g^+_1 = (g^+_{10}, g^+_{11})$ is a Groebner basis $G^+$ for the next error locator.

6. The ASIC of claim 4, the method further comprising determining whether a root discrepancy is zero for $j=1$ and a derivative discrepancy is zero for $j=1$, and stopping setting of $g^+_j$, if it is determined that both the root discrepancy and the derivative discrepancy are zero for $j=1$.

7. The ASIC of claim 4, further comprising tracking a degree of Groebner basis function $g_{00}$ with a variable $d_0$ by increasing $d_0$ by 1 whenever $j^*=0$.

8. The ASIC of claim 4, further comprising:
tracking two polynomials $g_{01}(X)$, $g_{11}(X)$; and calculating $g_{j0}(\alpha_r^{-1})$ by using the key equation for $j=0,1$.

9. The ASIC of claim 8, wherein calculating $g_{j0}(\alpha_r^{-1})$ comprises:

calculating and storing, for $k=2t-\delta-1$ to $2t-2$, $\tilde{B}_{k+1} = \alpha_r^{-1} \cdot \tilde{B}_k - (g_{j1})_{2t-1-k}$ and result=result+$S_{k+1}\tilde{B}_{k+1}$, wherein $\delta := \deg(g_{j1})$, $\tilde{B}_k$ is initialized to 0, $(g_{j1})_m$ is a coefficient of $X^m$ in $g_{j1}$, result is initialized to 0, and $S_{k+1}$ is a coefficient of the syndrome polynomial;

updating result=result·$(\alpha_r^{-1})^{2t}$; and outputting result, wherein the steps of calculating and storing, for $k=2t-\delta-1$ to $2t-2$, $\tilde{B}_{k+1}$ and result, updating result and outputting result are performed while adjoining the next weak coordinate $\alpha_r$.

10. The ASIC of claim 9, further comprising calculating and storing $(\alpha_m^{-1})^{2t}$ for all weak coordinates $\alpha_m$, wherein $t=\lfloor (d-1)/2 \rfloor$ is an error correction radius of a GRS code of designed distance d.

11. A non-transitory program storage device readable by a computer, tangibly embodying a program of instructions executed by the computer to perform the method steps for fast Chase decoding of generalized Reed-Solomon (GRS) codes, the method comprising the steps of:

receiving, by the computer, a GRS codeword y=x+e from a communication channel, wherein where x is a transmitted ORS codeword, and e is an error vector;

using outputs of a syndrome-based hard-decision (HD) algorithm to find an initial Groebner basis $G=\{g_0=(g_{00}, g_{01}), g_1=(g_{10}, g_{11})\}$ for a solution module of a key equation, upon failure of HD decoding of the GRS codeword;

traversing a tree of error patterns in $$E_{i_1} \times \ldots \times E_{i_{n_0}}$$

on a plurality of unreliable coordinates to adjoin a next weak coordinate wherein $n_0$ is a number of the unreliable coordinates, $i_1, \ldots, i_{n_0}$ are the unreliable coordinates, vertices of the tree of error patterns correspond to error patterns, and edges connect a parent error pattern to a child error pattern having exactly one additional non-zero value, to find a Groebner basis $G^+$ for each adjoining error location; and outputting an estimated transmitted codeword $\hat{x} := y+\hat{e}$ when a correct error vector $\hat{e}$ has been found.

12. The computer readable program storage device of claim 11, wherein the syndrome-based HD algorithm is selected from a group that includes the Berlekamp-Massey (BM) algorithm and Fitzpatrick's algorithm.

13. The computer readable program storage device of claim 11, wherein finding an initial Groebner basis G comprises:

defining polynomials $b_1 := (S\sigma \mod X^{d-1}, \sigma)$, and $b_2 := (SX^mB \mod X^{d-1}, X^mB)$, wherein S is the syndrome polynomial, $\sigma$ is the estimated ELP output by the BM algorithm, m is the number of iterations since the last linear feedback shift register (LFSR) length change in the BM algorithm, and B is a polynomial output from the BM algorithm that is a copy of the last estimated ELP $\sigma$ before the LFSR length L was updated; and outputting one of (1) $c\{b_1, b_2\}$ as the Groebner basis when leading monomials of $b_1$ and $b_2$ contain distinct unit vectors, for a non-zero constant c; (2) $\{d(b_1-cX^lb_2), db_2\}$ as the Groebner basis when the leading monomials contain a same unit vector and the leading monomial of $b_1$ is at least as large as that of $b_2$, wherein $c \in K^*$ and $l \in N$ are chosen such that the leading monomial of $b_2$ is canceled and d is a non-zero constant, or (3) $\{db_1, d(b_2-cX^lb_1)\}$ as the Groebner basis when the leading monomials contain the same unit vector and the leading monomial of $b_2$ is strictly larger than that of $b_1$, wherein $c \in K^*$ and $l \in N^*$ are chosen such that the leading monomial of $b_2$ is canceled and d is a non-zero constant.

14. The computer readable program storage device of claim 11, wherein traversing a tree of error patterns to find a Groebner basis $G^+$ for each adjoining error location comprises:

calculating a root discrepancy $\Delta_j^{rt} := g_{j1}(\alpha_r^{-1})$ for $j=0$ and 1, wherein $g_0=(g_{00}(X), g_{01}(X))$ and $g_1=(g_{10}(X), g_{11}(X))$ constitute a current Groebner basis and $\alpha_r$ is a next error location and r is a number of error locations;
setting, when a set $$J := \{j \in \{0, 1\} \mid \Delta_j^{rt} \neq 0\} \neq \emptyset, g_j^+ := c\left(g_j - \frac{\Delta_j^{rt}}{\Delta_{j*}^{rt}} g_{j*}\right)$$

when (j≠j'), wherein j*∈J is such that a leading monomial of $g_{j*}$ is a minimum leading monomial of $(g_j)$ for all j∈J and c is a non-zero constant, or $g_j^+ := c (X-\alpha_r^{-1})g_{j*}$ when j=j*, wherein X is a free variable;
setting $g_j := g_j^+$ for j=0 and 1;
calculating a derivative discrepancy $\Delta_j^{der} := \beta_r \alpha_r g'_{j1} (\alpha_r^{-1}) + \alpha_r g_{j0}(\alpha_r^{-1})$ for j=0 and 1, wherein $\beta_r$ is a value of location $\alpha_r$, and $g'_{j1}(X)$ is a formal derivative of $g_{j1}(X)$;
setting, when a set $$J := \{j \in \{0, 1\} \mid \Delta_j^{der} \neq 0\} \neq \emptyset, g_j^+ := c\left(g_j - \frac{\Delta_j^{der}}{\Delta_{j*}^{der}} g_{j*}\right)$$

when (j≠j), wherein j*∈J is such that a leading monomial of $M(g_{j*}) :=$ a minimum leading monomial of $(g_j)$ for all j∈J and c is a non-zero constant, or $g_j^+ := c(X-\alpha_r^{-1})g_{j*}$ when j=j*.

15. The computer readable program storage device of claim 14, further comprising, when set $J:=\{j\in\{0, 1\}|\Delta_j^{rt}\neq 0\}=\emptyset$ or when set $J:=\{j\in\{0, 1\}|\Delta_j^{der}\neq 0\}=\emptyset$, setting $g_j^+ := g_j$ for j=0, 1,
wherein $g_0^+ = (g_{00}^+, g_{01}^+)$ and $g_1^+ = (g_{10}^+, g_{11}^+)$ is a Groebner basis $G^+$ for the next error locator.

16. The computer readable program storage device of claim 14, the method further comprising determining whether a root discrepancy is zero for j=1 and a derivative discrepancy is zero for j=1, and stopping setting of $g_j^+$, if it is determined that both the root discrepancy and the derivative discrepancy are zero for j=1.

17. The computer readable program storage device of claim 14, further comprising tracking a degree of Groebner basis function $g_{00}$ with a variable $d_0$ by increasing $d_0$ by 1 whenever j*=0.

18. The computer readable program storage device of claim 14, further comprising:
tracking two polynomials $g_{01}(X)$, $g_{11}(X)$; and calculating $g_{j0}(\alpha_r^{-1})$ by using the key equation for j=0,1.

19. The computer readable program storage device of claim 18, wherein calculating $g_{j0}(\alpha_r^{-1})$ comprises:
calculating and storing, for k=2t−δ−1 to 2t−2, $\tilde{B}_{k+1} = \alpha_r^{-1} \cdot \tilde{B}_k - (g_{j1})_{2t-1-k}$ and result=result+$S_{k+1}\tilde{B}_{k+1}$, wherein $\delta := \deg(g_{j1})$, $\tilde{B}_k$ is initialized to 0, $(g_{j1})_m$ is a coefficient of $X^m$ in $g_{j1}$, result is initialized to 0, and $S_{k+1}$ is a coefficient of the syndrome polynomial;
updating result=result·$(\alpha_r^{-1})^{2t}$; and
outputting result,
wherein the steps of calculating and storing, for k=2t−δ−1 to 2t−2, $\tilde{B}_{k+1}$ and result, updating result and outputting result are performed while adjoining the next weak coordinate $\alpha_r$.

20. The computer readable program storage device of claim 19, further comprising calculating and storing $(\alpha_m^{-1})^{2t}$ for all weak coordinates $\alpha_m$, wherein $t = \lfloor (d-1)/2 \rfloor$ is an error correction radius of a GRS code of designed distance d.

* * * * *